US007371666B2

(12) United States Patent
Swihart et al.

(10) Patent No.: US 7,371,666 B2
(45) Date of Patent: May 13, 2008

(54) PROCESS FOR PRODUCING LUMINESCENT SILICON NANOPARTICLES

(75) Inventors: Mark T. Swihart, Williamsville, NY (US); Xuegeng Li, Hamburg, NY (US); Yuanqing He, Lockport, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

(21) Appl. No.: 10/796,442

(22) Filed: Mar. 9, 2004

(65) Prior Publication Data

US 2004/0229447 A1 Nov. 18, 2004

Related U.S. Application Data

(60) Provisional application No. 60/493,034, filed on Aug. 6, 2003, provisional application No. 60/454,374, filed on Mar. 12, 2003.

(51) Int. Cl.
*H01L 21/36* (2006.01)
*H01L 21/20* (2006.01)
(52) U.S. Cl. .................. 438/507; 977/774; 977/814
(58) Field of Classification Search ............. 438/507
See application file for complete search history.

(56) References Cited

U.S. PATENT DOCUMENTS 4,613,440 A * 9/1986 Zupancic et al. ......... 210/490
6,471,930 B2 10/2002 Kambe et al.
6,585,947 B1 * 7/2003 Nayfeh et al. ............. 423/348
6,586,785 B2 7/2003 Flagan et al.
6,743,406 B2 6/2004 Nayfeh et al.
6,846,565 B2 * 1/2005 Korgel et al. ............. 428/402
2002/0142218 A1 10/2002 Reitz et al.
2004/0076813 A1 * 4/2004 Han et al. ................. 428/312.6

OTHER PUBLICATIONS

Ehbreht, "Deposition and Analysis of Carbon and Silicon Clusters Generated by laser—Induced Gas Phase Reaction," Proc. SPIE, pp. 171-172 (1996).*
Withrow, "Effects Of Hydrogen In The Annealing Environment On Photoluminiscence From Si Nanoparticles," J. Appl. Phys., vol. 86 (1), p. 396 (1999).*
Bocarsly, "Surface—Chemical Control Of Optical Quenching Process At Porous Silicon Interfaces: Generation Of a Stable—Selective Sulfur—Dioxide Sensor," Abstract of Paper presented in ACS National meetings, Mar. 2000.*
Huisken, "Light—Emitting Silicon Nanocrystals From laser Pyrolysis", Advanced Materials, vol. 14 (24), p. 1861 (2002).*

(Continued)

*Primary Examiner*—Asok Kumar Sarkar
(74) *Attorney, Agent, or Firm*—Nixon Peabody LLP

(57) ABSTRACT

A process for producing brightly photoluminescent silicon nanoparticles with an emission spanning the visible spectrum is disclosed. In one aspect, the process involves reacting a silicon precursor in the presence of a sheath gas with heat from a radiation beam under conditions effective to produce silicon nanoparticles and acid etching the silicon nanoparticles under conditions effective to produce photoluminescent silicon nanoparticles. Methods for stabilizing photoluminescence of photoluminescent silicon nanoparticles are also disclosed.

29 Claims, 11 Drawing Sheets

OTHER PUBLICATIONS

Li, "Photothermal Aerosol Synthesis Of And Photoluminescence From Silicon Nanoparticles," Paper Presented at Annual meeting, American Institute Of Chemical Engineers, p. 1284 (2002).*

Zou, "Surface Functionalization Of Si Nanoclusters With Alkoxide and NMR Studies," Abstract of Paper presented in ACS National meetings, Mar. 2003.*

Ostraat et al., "Ultraclean Two-Stage Aerosol Reactor for Production of Oxide-Passivated Silicon Nanoparticles for Novel Memory Devices," *J. Electrochem. Soc.* 148:G265-G270 (2001).

Ostraat et al., "Synthesis and Characterization of Aerosol Silicon Nanocrystal Nonvolatile Floating-Gate Memory Devices," *Applied Physics Letters* 79:433-435 (2001).

Ding et al., "Electrochemistry and Electrogenerated Chemiluminescence from Silicon Nanocrystal Quantum Dots," *Science* 296:1293-1297 (2002).

Brus, "Luminescence of Silicon Materials: Chains, Sheets, Nanocrystals, Nanowires, Microcrystals, and Porous Silicon," *J. Phys. Chem.* 98:3575-3581 (1994).

Brus et al., "Electronic Spectroscopy and Photophysics of Si Nanocrystals: Relationship to Bulk c-Si and Porous Si," *J. Am. Chem. Soc.* 117:2915-2922 (1995).

Nayfeh et al., "Stimulated Blue Emission in Reconstituted Films of Ultrasmall Silicon Nanoparticles," *Applied Physics Letters* 78:1131-1133 (2001).

Holmes et al., "Highly Luminescent Silicon Nanocrystals with Discrete Optical Transitions," *J. Am. Chem. Soc.* 123:3743-3748 (2001).

English et al., "Size Tunable Visible Luminescence from Individual Organic Monolayer Stabilized Silicon Nanocrystal Quantum Dots," *Nano Letters* 2:681-685 (2002).

Baldwin et al., "Solution Reduction Synthesis of Surface Stabilized Silicon Nanoparticles," *Chem. Commun.* 1822-1823 (2002).

Heath, "A Liquid-Solution-Phase Synthesis of Crystalline Silicon," *Science* 258:1131-1133 (1992).

Belomoin et al., "Observation of a Magic Discrete Family of Ultrabright Si Nanoparticles," *Applied Physics Letters* 80:841-843 (2002).

Nayfeh et al., "Second Harmonic Generation in Microcrystalline Films of Ultrasmall Si Nanoparticles," *Applied Physics Letters* 77:4086-4088 (2000).

Bley et al., "A Low-Temperature Solution Phase Route for the Synthesis of Silicon Nanoclusters," *J. Am. Chem. Soc.* 118:12461-12462 (1996).

Liu et al., "A New Synthesis Route for the Synthesis of Hydrogen Terminated Silicon Nanoparticles," *Materials Science and Engineering* B96:72-75 (2002).

Mayeri et al., "NMR Study of the Synthesis of Alkyl-Terminated Silicon Nanoparticles from the Reaction of $SiCl_4$ with the Zintl Salt, NaSi," *Chem. Mater.* 13:765-770 (2001).

Lam et al., "Large-Scale Synthesis of Ultrafine Si Nanoparticles by Ball Milling," *Journal of Crystal Growth* 220:466-470 (2000).

Borsella et al., "Optical and Morphological Characterization of Si Nanocrystals/Silica Composites Prepared by Sol-gel Processing," *Materials Science and Engineering* B79:55-62 (2001).

Botti et al., "Photoluminescence from Silicon Nano-Particles Synthesized by Laser-Induced Decomposition of Silane," *Journal of Applied Physics* 88:3396-3401 (2000).

Ehbrecht et al., "Photoluminescence and Resonant Raman Spectra of Silicon Films Produced by Size-Selected Cluster Beam Deposition," *Physical Review* 56:6958-6964 (1997).

Huisken et al., "Structured Films of Light-Emitting Silicon Nanoparticles Produced by Cluster Beam Deposition," *Applied Physics Letters* 74:3776-3778 (1999).

Ledoux et al., "Photoluminescence of Size-Separated Silicon Nanocrystals: Confirmation of Quantum Confinement," *Applied Physics Letters* 80:4834-4836 (2002).

Ledoux et al., "Effect of Passivation and Aging on the Photoluminescence of Silicon Nanocrystals," *Applied Physics Letters* 79:4028-4030 (2001).

Seraphin et al., "Influence of Nanostructure Size on the Luminescence Behavior of Silicon Nanoparticle Thin Films," *Journal of Materials Research* 12:3386-3392 (1997).

Wilson et al., "Quantum Confinement in Size-Selected, Surface-Oxidized Silicon Nanocrystals," *Science* 262:1242-1244 (1993).

Littaus et al., "A Luminescent Silicon Nanocrystal Colloid via a High-Temperature Aerosol Reaction," *J. Phys. Chem.* 97:1224-1230 (1993).

Higashi et al., "Comparison of Si(111) Surfaces Prepared Using Aqueous Solutions of $NH_4$ F versus HF," *Appl. Phys. Lett.* 58:1656-1658 (1991).

Lie et al., "Preparation and Characterisation of Luminescent Alkylated-Silicon Quantum Dots," *Journal of Electroanalytical Chemistry* 538:539:183-190 (2002).

Buriak, "Organometallic Chemistry on Silicon and Germanium Surfaces," *Chem. Rev.* 102:1271-1308 (2002).

Wojtyk et al., "Modification of Porous Silicon Surfaces with Activated Ester Monolayers," *Langmuir* 18:6081-6087 (2002).

Li et al., "Luminescent Silicon Nanoparticles Capped by Conductive Polyaniline through the Self-Assembly Method," *Langmuir* 20:1963-1971 (2004).

Murray et al., "Synthesis and Characterization of Nearly Monodisperse CdE (E = S, Se, Te) Semiconductor Nanocrystallites," *J. Am. Chem. Soc.* 115:8706-8715 (1993).

Murray et al., "Synthesis and Characterization of Monodisperse Nanocrystals and Close-Packed Nanocrystal Assemblies," *Annu. Rev. Mater. Sci.* 30:545-610 (2000).

Fojtik et al., "Formation of Nanometer-Size Silicon Particles in a Laser Induced Plasma in $SiH_4$ ," *Ber. Bunsenges. Phys. Chem.* 97:1493-1496 (1993).

Fojtik et al., "Luminescent Colloidal Silicon Particles," *Chem. Phys. Lett.* 221:363-367 (1994).

* cited by examiner

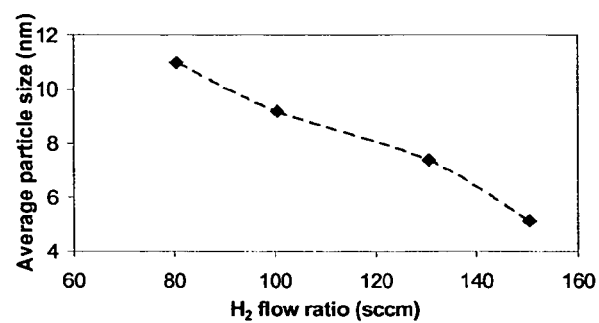
Figure 3A
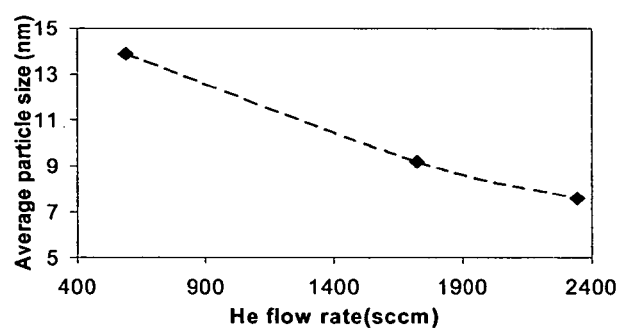
Figure 3B
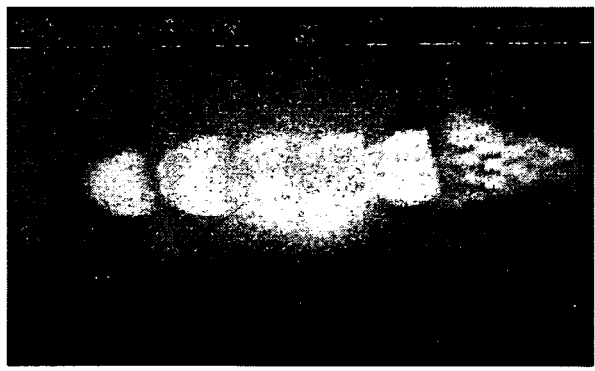 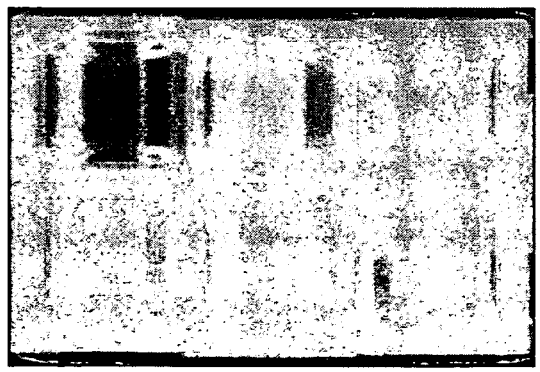
Figure 4A               Figure 4B

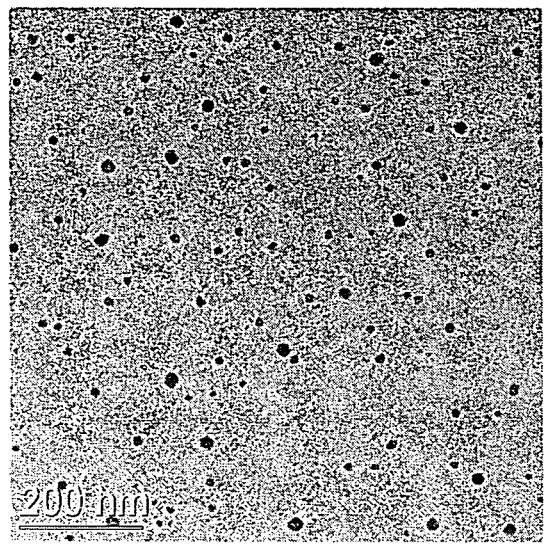 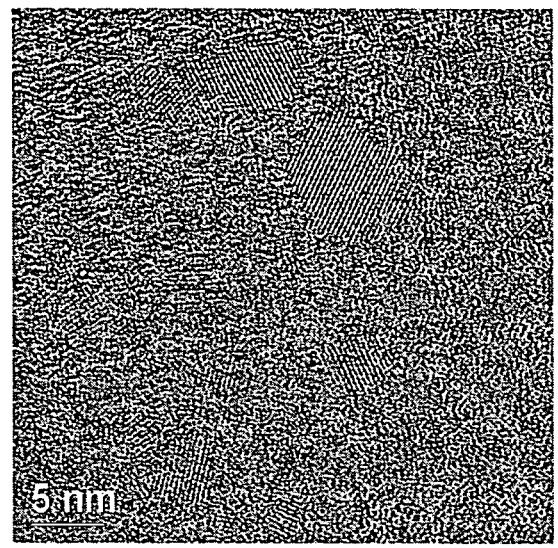
Figure 13A  Figure 13B
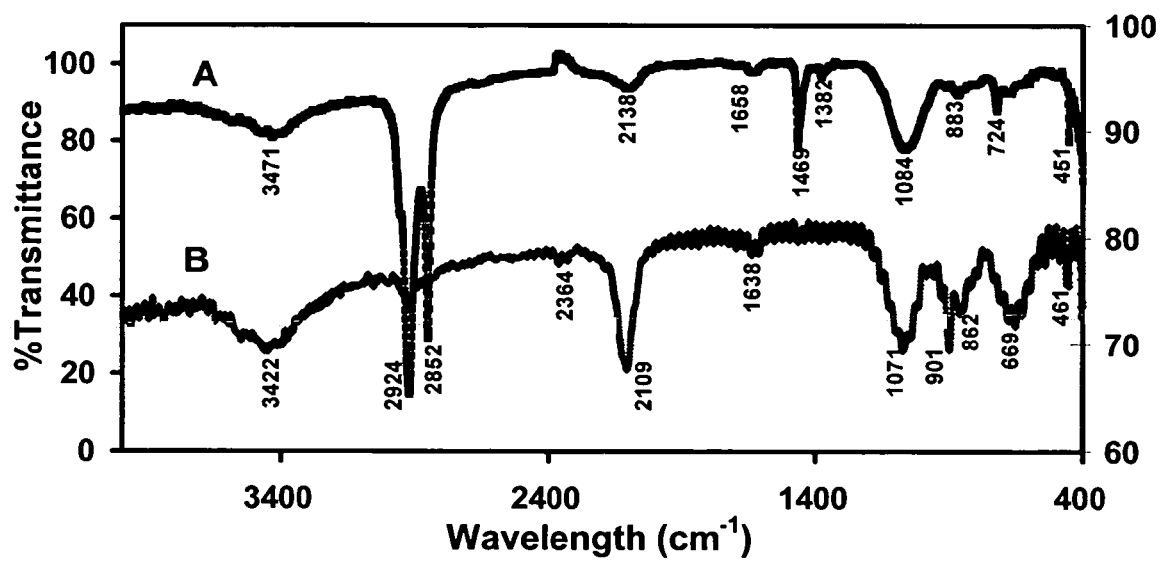
Figure 14

PROCESS FOR PRODUCING LUMINESCENT SILICON NANOPARTICLES

This application claims the benefit of U.S. Provisional Patent Application Ser. Nos.: 60/454,374 and 60/493,034, filed Mar. 12, 2003, and Aug. 6, 2003, respectively, and which are hereby incorporated by reference in their entirety.

FIELD OF THE INVENTION

This invention relates to a process for producing photoluminescent silicon nanoparticles.

BACKGROUND OF THE INVENTION

The possibility of constructing optoelectronic devices, full-color displays, and optical sensors based on silicon has generated tremendous interest in the preparation and characterization of light emitting silicon nanoparticles. Because the particles' luminescence properties are size-dependent, multiple colors can be produced using a single material. These particles also have exciting potential applications as fluorescent tags for biological imaging, as has been proposed for II-VI compound semiconductor nanoparticles. Chan et al., *Science* 281:2016-2018 (1998); Bruchez et al., *Science* 281:2013-2015 (1998); Lacost et al., *Proc. Natl. Acad. Sci., USA* 97:9461-9466 (2000). They can be brighter and much more stable to photobleaching than the organic dyes used in these applications, and they also have much broader excitation spectra, so that emission at multiple wavelengths (from particles of different sizes) can be excited by a single source. There are established methods for preparation of luminescent porous silicon (Lockwood (ed.), *Light Emission in Silicon From Physics to Devices* (1998)), and aerosol synthesis of macroscopic quantities of non-luminescent silicon nanoparticles has been known for over 20 years. Cannon et al., *J. Am. Ceramic Soc.* 65:324-335 (1982). However, there are no reported methods for producing macroscopic quantities (i.e. more than a few milligrams) of luminescent silicon nanoparticles that are free from a substrate. Soon after the initial discovery of photoluminescence from porous silicon (Canham, *Appl. Phys. Lett.* 57:1046-1048 (1990)), Brus and co-workers published a series of papers (Wilson et al., *Science* 262:1242-1244 (1993); Littau et al., *J. Phys. Chem.* 97:1224-1230 (1993); Brus, *J. Phys. Chem.* 98:3575-3581 (1994); Brus et al., *J. Am. Chem. Soc.* 117:2915-2922 (1995)) in which they prepared silicon nanoparticles by high temperature decomposition of disilane. These studies were instrumental in building an understanding of photoluminescence mechanisms in silicon nanostructures. However, in their actual particle synthesis experiments, they collected less than 10 mg of particles per 24 hour day of reactor operation. Littau et al., *J. Phys. Chem.* 97:1224-1230 (1993). Small quantities of luminescent silicon nanoparticles have been prepared by laser vaporization controlled condensation (LVCC). Carlisle et al., *Chem. Phys. Lett.* 326:335-340 (2000); Carlisle et al., *J. Electon Spectrosc.* 114-116:229-234 (2001).

Recently, Korgel and co-workers prepared brightly luminescent silicon nanoparticles in supercritical organic solvents at high temperature (500° C.) and pressure (345 bar). Ding et al., *Science* 296:1293-1297 (2002); English et al., *Nano. Lett.* 2:681-685 (2002); Holmes et al., *J. Am. Chem. Soc.* 123:3743-3748 (2001). Again, they have produced beautiful and well-characterized particles, but in quite small quantities. In their first report, 0.2 ml per batch of 250-500 mM diphenylsilane was converted to silicon nanoparticles with a yield of 0.5% to 5%, which corresponds to 0.07 to 1.4 mg of Si nanoparticles per batch. Brightly luminescent silicon nanoparticles have been prepared by dislodging them from luminescent porous silicon wafers prepared electrochemically (Nayfeh et al., *Appl. Phys. Lett.* 78:1131-1133 (2001); Nayfeh et al., *Appl. Phys. Lett.* 77:4086-4088 (2000); Belomoin et al., *Appl. Phys. Lett.* 80:841-843 (2002)), and this has also generated tremendous technological and scientific interest. However, this method also generates small quantities of silicon nanocrystals, and the emitting nanocrystals may be embedded in larger porous silicon particles.

The first solution phase synthesis of silicon nanoparticles was presented by Heath (*Science* 258:1131-1133 (1992)). More recently Kauzlarich and co-workers have demonstrated several procedures (Baldwin et al., *Chem. Comm.* 17:1822-1823 (2002); Bley et al., *J. Am. Chem. Soc.* 118:12461-12462 (1996); Liu et al., *Mat. Sci. Eng. B.* B96:72-75 (2002); Mayeri et al., *Chem. Mat.* 13:765-770 (2001)) for producing silicon nanoparticles with a variety of surface terminations at mild conditions in solution using reactive Zintl salts. They are able to produce larger quantities of particles than the methods described in the previous paragraph. In some cases, they have shown blue-UV photoluminescence from these particles, but appear not to have observed the orange to red PL characteristic of porous silicon and most other nanoparticle preparation methods, including that presented here. Solid phase reactions have also been used to produce larger quantities of silicon nanoparticles, but apparently with much lower PL efficiency than the particles measured in the previous paragraph. Lam et al. produced silicon nanoparticles by the reaction of graphite with silicon dioxide ($SiO_2$) in a ball mill (*J. Crystal Growth* 220:466-470 (2000). A wide range of particle sizes were produced, but some PL was observed after ball milling for 7 to 10 days. Ostraat and co-workers have prepared oxide-capped silicon nanoparticles via vapor phase decomposition of highly diluted $SiH_4$ in nitrogen followed immediately by surface oxidation. Ostraat et al., *J. Electrochem. Soc.* 148: G265-G270 (2001); Ostraat et al., *Appl. Phys. Lett.* 79:433-435 (2001).

$CO_2$ laser pyrolysis of silane ($SiH_4$) is an effective method of producing gram-scale quantities of silicon nanoparticles, as first shown more than 20 years ago. Cannon et al., *J. Am. Ceramic Soc.* 65:324-335 (1982). It produces high-purity loosely agglomerated particles with controlled primary particle size and size distribution. Moreover, it is a continuous process that permits reasonable production rates. While several groups have synthesized silicon particles with this and similar methods, the resulting particles showed little or no visible photoluminescence. Borsella et al., *Mat. Sci. Eng. B.* B79:55-62 (2001); Borsella et al., *J. Mat. Sci. Lett.* 16:221-223 (1997); Botti et al., *J. Appl. Phys.* 88:3396-3401 (2000). An exception to this is the work of Huisken and coworkers, who use pulsed $CO_2$ laser pyrolysis of silane, which yields luminescent particles, but in very small quantities. They have also studied the effect of particle aging in air and surface etching with HF on the photoluminescence spectrum. Ehbrecht et al., *Phys. Rev. B.* 56:6958-6964 (1997); Huisken et al., *Appl. Phys. Lett.* 74:3776 (1999); Ledoux et al., *Mater. Sci. Eng.* C19:215-218 (2002); Ledoux et al., *Appl. Phys. Lett.* 80:4834-4836 (2002); Ledoux. et al., *Appl. Phys. Lett.* 79:4028-4030 (2001).

In order to show efficient visible photoluminescence (PL), it is believed that silicon nanoparticles must be smaller than 5 nm, and their surface must be 'properly passivated' such that there are no non-radiative recombination sites on it. The mechanism(s) of photoluminescence in silicon nanocrystals and the effect of surface passivation on light emission from them remain topics of active research and debate. The size of silicon nanoparticles can be reduced by etching them in mixtures of hydrofluoric acid (HF) and nitric acid ($HNO_3$) (Seraphin et al., *J. Mater. Res.* 12:3386-3392 (1997)) as well as by aging them in air then removing the resulting oxide with HF. Ledoux. et al., *Appl. Phys. Lett.* 79:4028-4030 (2001).

The present invention is directed at overcoming these and other deficiencies in the art.

SUMMARY OF THE INVENTION

One aspect of the present invention relates to a process for producing photoluminescent silicon nanoparticles. This involves reacting a silicon precursor in the presence of a sheath gas with heat from a radiation beam under conditions effective to produce silicon nanoparticles. The silicon nanoparticles are then acid etched under conditions effective to produce photoluminescent silicon nanoparticles.

Another aspect of the present invention is directed to a process for producing photoluminescent silicon nanoparticles. This involves thermally decomposing a silicon precursor in the presence of a sheath gas with $CO_2$ laser radiation under conditions effective to produce silicon nanoparticles. The silicon nanoparticles are then acid etched with a solution containing both hydrofluoric acid and nitric acid under conditions effective to produce photoluminescent silicon nanoparticles.

Another aspect of the present invention is a process for altering photoluminescence of silicon nanoparticles which involves acid etching silicon nanoparticles under conditions effective to produce photoluminescent silicon nanoparticles.

The method of the present invention is unique in being able to produce macroscopic quantities (up to a few hundred milligrams in a few hours in the herein described small bench-scale implementation) of silicon nanoparticles with bright visible photoluminescence (PL). Silicon nanoparticle dispersions in water and methanol with bright visible PL were also produced and characterized. These dispersions usually exhibited blue shift in their PL spectra with time as well as changes in PL intensity for the first few days after preparation. PL from powder samples was generally stable with time, except for some samples with green emission, for which the PL tended to shift toward the red with time. The PL from particles after etching can be stabilized significantly by chemical oxidization using, for example, $HNO_3$. The particles produce stable colloidal dispersions in diols and triols.

Thus, a further aspect of the present invention is a process for stabilizing photoluminescence of silicon nanoparticles by treating photoluminescent silicon nanoparticles with an oxidizer under conditions effective to achieve particle surface oxidation.

Modification of the nanoparticle surfaces with organic compounds can also further stabilize the PL and make them dispersable in a wide range of solvents. Surface coating, such as attachment of organic molecules to hydrogen terminated and hydroxyl terminated surfaces of these nanoparticles has been shown to significantly stabilize the PL of the nanoparticles against degradation.

Thus, an aspect of the present invention is a process for stabilizing photoluminescence of silicon nanoparticles that involves treating photoluminescent silicon nanoparticles under conditions effective to produce photoluminescent silicon nanoparticles having an Si—H terminated surface, and then treating the Si—H surface-terminated nanoparticles under conditions effect to achieve particle surface hydrosilylation.

Another aspect of the present invention is a process for stabilizing photoluminescence of silicon nanoparticles that involves treating photoluminescent silicon nanoparticles under conditions effective to produce photoluminescent silicon nanoparticles having an Si—OH terminated surface, and then treating the Si—OH surface-terminated nanoparticles under conditions effect to achieve particle surface silanization.

According to the invention, a controlled acid etching process can induce bright, visible photoluminescence in silicon nanoparticles produced by laser pyrolysis of a silicon precursor, such as a silane, that do not show significant photoluminescence before etching. The photoluminescence properties of these particles appear to be very similar to those of both porous silicon and the aerosol-synthesized particles produced in much smaller quantities by Brus et al., and Huisken et al., as described above. One significant advantage of the present invention is that it enables the production of macroscopic quantities (up to a few hundred milligrams in a few hours in the herein described small bench-scale implementation) of silicon nanoparticles with bright visible photoluminescence. Availability of these quantities of particles allows the study of their surface functionalization and of their incorporation into devices that simply is not possible with the smaller quantities of free silicon particles produced by other methods.

BRIEF DESCRIPTION OF THE DRAWINGS

FIGS. 3A and 3B are graphic representations of dependence of particle size on carrier gas flow rates for typical reactor conditions. Particle diameter is based on BET surface area measurement. In FIG. 3A the $H_2$ flow plotted is through the central inlet with the $SiH_4$. Other flow rates are as follows. In FIG. 3A, $SiH_4$=24 sccm, He=1450 sccm, $H_2$ (outer inlet)=800 sccm, $SF_6$=3.2 sccm. In FIG. 3B, $SiH_4$=48 sccm, $H_2$ (center inlet)=40 sccm, $SF_6$=0 sccm.

FIGS. 4A and 4B are photographs of samples with bright visible PL under UV illumination, (FIG. 4A) powder sample; (FIG. 4B) particles from the same experiment dispersed in methanol. From left to right in FIG. 4A and from upper left to lower right in FIG. 4B etching time increases, and therefore particle size decreases. The powder samples are illuminated from above, while the dispersions are illuminated from below. Both are photographed from above.

FIG. 10A represents particles dispersed in methanol, and FIG. 10B represents particles dispersed in water.

FIGS. 13A and 13B show TEM images of particles coated with octadecene.

FIG. 14 is a graphic representation of FTIR spectra for etched, surface-functionalized particles (A) and etched particles (B).

DETAILED DESCRIPTION OF THE INVENTION

Figure 1:
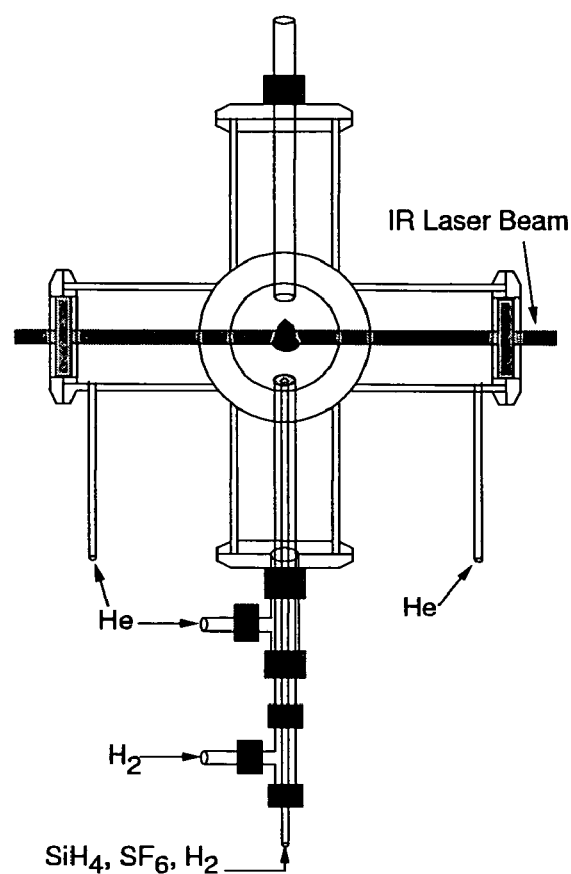
FIG. 1 is a schematic representation of a laser-driven aerosol reactor of the present invention.

The present invention relates to a combined vapor phase and solution phase process for producing photoluminescent silicon nanoparticles. In one aspect, the process involves reacting a silicon precursor in the presence of a sheath gas with heat from a radiation beam under conditions effective to produce silicon nanoparticles and then acid etching the silicon nanoparticles under conditions effective to produce photoluminescent silicon nanoparticles.

Preferably, the silicon precursor is a silane. Examples may include, but are not limited to, silane ($SiH_4$), disilane ($Si_2H_6$), trisilane ($Si_3H_8$), etc., chlorosilanes, such as, for example, dichlorosilane ($SiH_2Cl_2$), trichlorosilane ($SiHCl_3$), silicon tetrachloride ($SiCl_4$), hexachlorodisilane ($Si_2Cl_6$), and others. The radiation beam is preferably produced by a laser, and more preferably, by a $CO_2$ laser.

The sheath gas preferably includes hydrogen, and may include an inert gas such as, helium, argon or nitrogen, or a mixture thereof.

Reaction of the silicon precursor in the presence of the sheath gas may be carried out in the presence of a photosensitizer, such as, for example, sulfur hexafluoride ($SF_6$) or silicon tetrafluoride ($SiF_4$). $SF_6$, for example, functions to increase the temperature achieved for a given laser power.

Due to the rapid heating provided by the radiation beam, and the rapid cooling provided by mixing with the unheated sheath gas, higher concentrations of the silicon precursor may be used than in a conventional aerosol reactor. The time scale for heating and cooling according to the present invention is a few milliseconds. Slower heating and cooling would require much smaller concentrations to produce particles of the same size. This is evident in the work by Ostraat et al. (*J. Electrochem. Soc.* 148:G265-G270 (2001); *Appl. Phys. Lett.* 79:433-435 (2001), which are hereby incorporated by reference in their entirety) where 50 parts per billion of silane in nitrogen was used to produce 8 nm particles in a reactor with a three second residence time. The residence time is about 1000 times longer, and the silane concentration is about 100,000 times lower, than required by the present invention.

Silicon nanoparticles produced by the vapor phase step of the process of the present invention may be collected on a filter, such as, for example, a cellulose nitrate membrane filter, according to known procedures. Particles might also be collected, for example, by thermophoretic deposition onto a cooled surface or by electrophoretic deposition onto an electrically charged surface. They might also be collected directly into a liquid solution by bubbling the reactor effluent through the solution, or through two or more bubblers of solution in series. Nanoparticles having an average diameter less than about 20 nm, and as small as about 5 nm are produced by the vapor phase synthesis step of the present invention.

Prior to acid etching, the silicon nanoparticles produced by the vapor phase step of the process of the present invention may be dispersed in a solvent, such as, for example, water or an alcohol, such as methanol or isopropanol.

The solution phase step of the process of the present invention involves acid etching of the as-produced silicon nanoparticles, which reduces the particle size and passivates the particle surface. Preferably, the acid etching is carried out with a solution containing both hydrofluoric acid and nitric acid. The solution preferably contains about 0.5% to 20% hydrofluoric acid and about 10% to 40% nitric acid. Acid etching may be carried out, for example, with a 3% hydrofluoric acid and 32% nitric acid solution. The mixture of silicon nanoparticles and acids is gently stirred to keep the particles suspended, and the photoluminescence is visually monitored. When the desired color is achieved, the particles are collected. Etching time is typically two to thirty minutes.

The etched particles may be collected, for example, on a filter, and washed. The filter may be, for example, a polyvinylidene fluoride membrane filter, which is compatible with the particular acids and solvents. The wash may, for example, include distilled water, methanol, or other solvent that aids in removing the residual acids so that etching is completely stopped. The etched particles may also be collected by centrifuging the mixture and then removing the supernatant (repeatedly).

Rather than stopping the reaction by filtering to remove the acids, the reaction might also be stopped by neutralizing the acids, by adding a base to the mixture. A suitable base would result in soluble salts that would not precipitate. Depending upon actual etching conditions and initial particle size, about 10% to 50% of the original particle mass is recovered after etching.

Photoluminescent silicon nanoparticles produced in accordance with the present invention may be further processed by treatment with an oxidizing agent, such as nitric acid. Preferably, the nitric acid is an about 20% to 40% nitric acid solution, and more preferably, a 30% nitric acid solution. Other oxidizing agents might include, for example, ozone, hydrogen peroxide, and mixtures of these with acids like sulfuric acid. The oxidizing agent initiates surface oxidation and serves to stabilize photoluminescence of the particles by preventing further changes in the state of the particle surface.

Following acid etching of the silicon nanoparticles, particles with peak emission in the orange spectral region may be isolated and treated under conditions known in the art effective to induce rapid thermal surface oxidation such that particles with emission in the blue are obtained. According to known procedures, orange-emitting nanoparticles are dispersed in a volatile solvent, such as chloroform. The solvent is evaporated and the particles heated under vacuum (to prevent oxidation during heating). Oxygen is supplied for a short time to partially, but not completely, oxidize the particles, which are then cooled under vacuum (to prevent further oxidation). If the particles are completely oxidized, photoluminescence disappears. The same process can be used to prepare green-emitting particles from red-emitting particles.

A further aspect of the present invention is a process for producing photoluminescent silicon nanoparticles which involves thermally decomposing a silicon precursor in the presence of a sheath gas with $CO_2$ laser radiation under conditions effective to produce silicon nanoparticles The silicon nanoparticles are then acid etched, for example, with a solution containing both hydrofluoric acid and nitric acid, under conditions effective to produce photoluminescent silicon nanoparticles.

Yet another aspect of the present invention is a process for altering photoluminescence of silicon nanoparticles which involves acid etching the silicon nanoparticles under conditions effective to produce photoluminescent silicon nanoparticles. Preferably, the acid etching is carried out with a solution containing both hydrofluoric acid and nitric acid.

Still another aspect of the present invention is a process for stabilizing photoluminescence of silicon nanoparticles which involves treating the photoluminescent silicon nanoparticles with an oxidizer under conditions effective to achieve particle surface oxidation.

EXAMPLES

Example 1

Laser Pyrolysis to Produce Non-luminescent Silicon Nanoparticles

The silicon powders were synthesized by laser-induced heating of silane ($SiH_4$) to temperatures where it dissociates, in the reactor shown schematically in FIG. 1. A continuous $CO_2$ laser beam (Coherent Inc., Santa Clara, Calif., Model 42 laser emitting up to 60 Watts) was focused to a diameter of about 2 mm just above the central reactant inlet, which was made from 1/8 inch O.D. tubing centered within a piece of 3/8 inch O.D. tubing through which a sheath flow of $H_2$ and/or helium entered the reactor. This sheath gas helps to confine the reaction zone to a small region near the axis of the reactor. The exact dimensions of the reaction zone are difficult to determine, but are probably of order 2 mm in both diameter and thickness.

Silane (electronic grade, Scott Gases, Plumsteadville, Pa.) weakly absorbs the laser energy at a wavelength of 10.6 microns, and is thereby heated. Sulfur hexafluoride ($SF_6$) may be added to the precursor stream as a photosensitizer. $SF_6$ (technical grade, Aldrich Chemical Co., Inc., Milwaukee, Wis.) has a large absorption cross-section at the laser wavelength and can therefore dramatically increase the temperature achieved for a given laser power. Helium (UFP, passed through an oxygen trap to remove residual $O_2$ and $H_2O$) and hydrogen (ultrapure carrier grade) flows confine the reactant and photosensitizer ($SF_6$) to a region near the axis of the reactor and prevent them from accumulating in the arms of the 6-way cross from which the reactor is constructed. Hydrogen also serves to increase the temperature at which particle nucleation occurs, and to decrease the particle growth rate, because it is a by-product of silane dissociation and particle formation. All gas flow rates to the reactor were controlled by mass flow controllers. The resulting particles were collected on cellulose nitrate membrane filters. The effluent was directed to a furnace where it was heated to 850° C. to decompose any residual silane. Typical experimental conditions were a total pressure of 540 mbar in the reactor; a laser power of 60 W; 24 sccm $SiH_4$, 2 sccm $SF_6$, and 100 sccm $H_2$ flowing through the central inlet (1/8 inch tube); 600 sccm $H_2$ flowing through the sheath inlet (3/8 inch tube); and 1500 sccm He (total) flowing through the four inlets near the four windows of the reactor.

This method can produce silicon nanoparticles at 20 to 200 mg per hour in the present configuration. With a commercially available multi-kilowatt laser focused into a thin sheet, one could readily scale this up by two orders of magnitude. By using an array of inlets of approximately the same dimensions as those used here, each surrounded by a sheath flow, it should be possible to mimic the conditions in the laboratory reactor. A possible configuration would be a 22 by 21 hexagonal array of 462 1/8 inch O.D. tubes in which each reactant inlet is surrounded by six sheath flow inlets (100 reactant inlets and 362 sheath inlets). This array would be about 7 cm wide and 6 cm deep. In conjunction with a 6 kW laser expanded into an 8 cm wide by 2 mm thick sheet and appropriate gas flow rates this would provide a straightforward 100-fold scale-up strategy. Laser power requirements could be reduced by reflecting the beam through the reaction zone multiple times, rather than using a single pass as is done in the laboratory experiments.

Example 2

Acid Etching to Produce Luminescent Silicon Nanoparticles

The powders obtained as described above were dispersed in methanol using mild sonication, then etched with solutions of 0.5 to 20% HF and 10% to 40% $HNO_3$ in water to reduce the particle size and passivate the particle surface. Acid solutions were prepared from 49-51 wt % HF, 68-70% $HNO_3$, and DI water in the necessary proportions. After etching, the particles were collected on polyvinylidene fluoride (PVDF) membrane filters (Millipore Corp., Billerica, Mass.) and washed with DI water and methanol. Depending on etching conditions and initial particle size, 10% to 50% of the original particle mass is recovered after this process.

Example 3

Characterization of Silicon Nanoparticles

The silicon nanoparticles were characterized by transmission electron microscopy (TEM) and specific surface area measurements (Brunauer-Emmett-Teller method) prior to etching and by TEM after etching. Photoluminescence spectra (fluorescence spectra) were recorded with a Perkin-Elmer (Newark, Conn.) LS 50 fluorescence spectrometer with a 351 nm bandpass filter used to suppress any scattered light from the source. The excitation wavelength was set to 355 nm, and the emission cutoff filter was set to 430 nm for most of the PL measurements shown here. For emission measurements on blue-emitting particles, the emission cutoff filter was set to 390 nm.

Example 4

Evaluation of Initial Non-luminescent Silicon Nanoparticles

Figure 2:
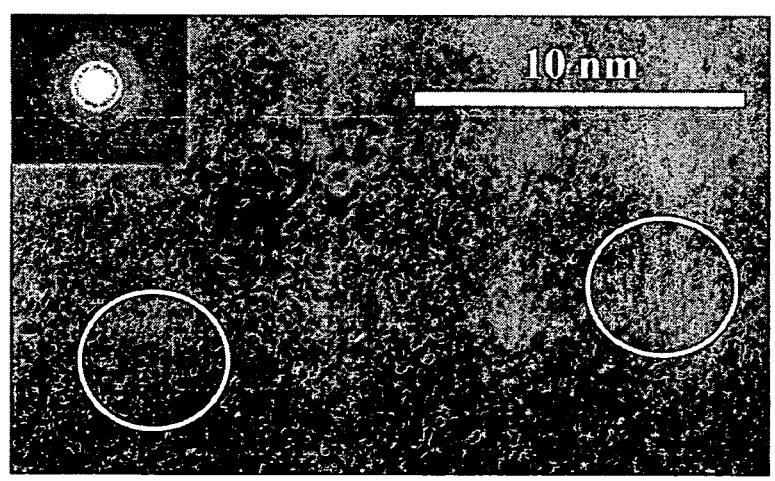
FIG. 2 is a transmission electron microscopy micrograph of silicon nanoparticles before etching. The inset shows the selected area electron diffraction pattern from the particles in the image. Two nanocrystals are circled for ease of identification.

The TEM micrograph (FIG. 2) and others like it show that the as synthesized powder in this case consists of nanocrystals with an average diameter near 5 nm. While many particles like those shown in FIG. 2 (two nanocrystals are circled for ease of identification) are clearly visible in TEM images, the image quality is not high enough to produce meaningful measurements of particle size distribution by particle counting. Selected area electron diffraction patterns obtained from the Si nanoparticles (FIG. 2, inset) show that the particles are a mixture of crystalline and amorphous material, or that the crystallites are too small to produce a well-defined diffraction pattern. No special precautions have been taken to avoid beam-induced heating, and the resultant possible melting, of the particles so this possibility cannot be definitively ruled out.

Nitrogen physisorption (the BET method, using Micromeretics® (Norcross, Ga.) model 2010 ASAP physisorption apparatus) was used to measure the specific surface area of particles. The measured surface area for the sample shown in FIG. 2 was 500 $m^2/g$. For spherical particles with the same density as bulk silicon, this is equivalent to a particle diameter of 5.2 nm. This is in close agreement with the TEM images. Particle size, crystallinity, and production rate can be controlled by varying the flow rates of $H_2$ and He to the reactor and by addition of $SF_6$. Changing these parameters allows production of particles with average diameters in the range of 5 to 20 nm. Larger particles are also easily produced, but are not presently of interest. FIGS. 3A and 3B show examples of the dependence of primary particle size on carrier gas flow rates (with $SiH_4$ flow rate and all other conditions held constant) for typical operating conditions and a total reactor pressure of 8 psia (540 mbar). Particle diameter is based on BET surface area measurement. In FIG. 3A, the $H_2$ flow plotted is through the central inlet with the $SiH_4$. Other flow rates are as follows. In FIG. 3A, $SiH_4$=24 sccm, He=1450 sccm, $H_2$ (outer inlet)=800 sccm, $SF_6$=3.2 sccm. In FIG. 3B, $SiH_4$=48 sccm, $H_2$ (center outlet)=40 sccm, $SF_6$=0 sccm.

Example 5

Evaluation of Photoluminescence Induced by Acid Etching

Figure 5:
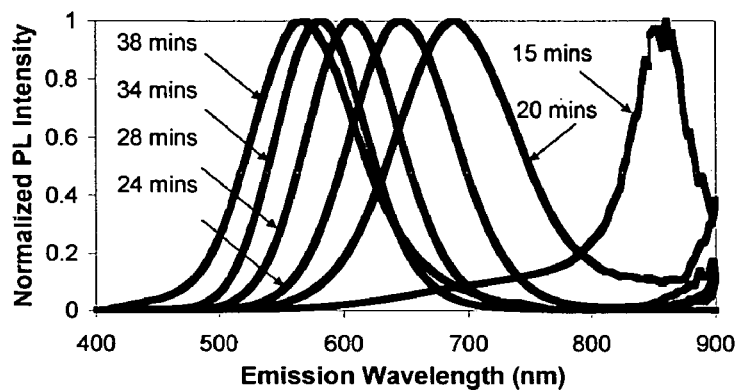
FIG. 5 is a graphic representation of normalized photoluminescence spectra from the dry powder samples shown in FIG. 4A, showing the decrease in peak emission wavelength with increasing etching time (and presumably, therefore with decreasing particle size) in roughly 3% HF/26% $HNO_3$ etching solution. The sensitivity of the R928 photomultiplier tube used here falls off sharply beyond 800 nm, and this is the source of the noisiness and odd shape of the 15 min spectrum. Spectra have been corrected for detector sensitivity and normalized.

Upon initial synthesis in the laser-driven reactor, the silicon nanoparticles exhibit little or no visible photoluminescence (PL) either as a dry powder or dispersed in solvents, although some weak PL in the infrared (beyond 850 nm) cannot be ruled out. After etching with $HF/HNO_3$ mixtures as described above, the particles exhibit bright visible PL. During the etching process, the nanoparticles are oxidized by $HNO_3$, and the resulting oxide is dissolved (etched) by HF, so that the size of the silicon core of the particles is reduced, and the surface is passivated with oxide produced by wet oxidation with $HNO_3$, rather than by the 'native oxide' that forms when the particles are exposed to room air. Powder samples and particle dispersions in water, methanol, and other solvents, with bright visible PL ranging from red to green have been produced as shown in FIGS. 4A, 4B and 5. From left to right in FIG. 4A and from upper left to lower right in FIG. 4B, etching time increases, and, therefore, particle size decreases. FIG. 5 shows the normalized photoluminescence spectra of the dry powder sample shown in FIG. 4A. FIG. 5 shows the decrease in peak emission wavelength with increasing etching time (and presumably, therefore, with decreasing particle size) in a roughly 3% HF/26% $HNO_3$ etching solution. The sensitivity of the R928 photomultiplier tube used here falls off sharply above 800 nm, and this is the source of the noisiness and odd shape of the 15 min spectrum. Spectra have been corrected for detector sensitivity and normalized. The emission wavelength decreases smoothly and monotonically with increasing etching time. This apparent size-dependent photoluminescence is comparable to that of the best published examples of silicon nanoparticles produced by electrochemical etching of silicon wafers. Belomoin et al., *Appl. Phys. Lett.* 80:841-843 (2002), which is hereby incorporated by reference in its entirety.

In FIGS. 4 and 5, the peak PL emission wavelength decreases from near 855 nm to 570 nm with increasing etching time. Other samples show peaks in the PL spectrum at wavelengths as low as 500 nm after etching. For powder samples and particle dispersions with a peak PL wavelength near 600 nm, the photoluminescence intensity and spectrum is relatively stable. However, preliminary results suggest that for dispersions of particles in water or methanol and, for samples with initial peak PL emission at shorter wavelengths, the spectrum changes with time after the etching procedure. This is discussed further below.

Preliminary attempts were made to measure the external quantum efficiency of the photoluminescence by reference to organic dyes. However, as discussed further below, without surface treatment, the particles do not form stable dispersions in organic solvents. Thus, the particle dispersions (of agglomerated particles) scattered a significant amount of the incoming (excitation) beam. So, when the dye solution and particle dispersion had the same transmission of the incident beam, in fact the particle dispersion was absorbing less light than the dye solution. These experiments gave external quantum efficiencies of about 0.5% to 1% at room temperature. However, due to the scattering from agglomerated particles, the true quantum efficiency could be much higher, and this must be regarded as a lower limit.

To further characterize the crystal structure, elemental concentrations and particle surface properties, powder x-ray diffraction (XRD), x-ray photoelectron spectroscopy (XPS) and Fourier transform infrared absorption spectroscopy (FTIR) measurements were conducted on powder samples of the luminescent Si nanoparticles.

Figures 6A, 6B:
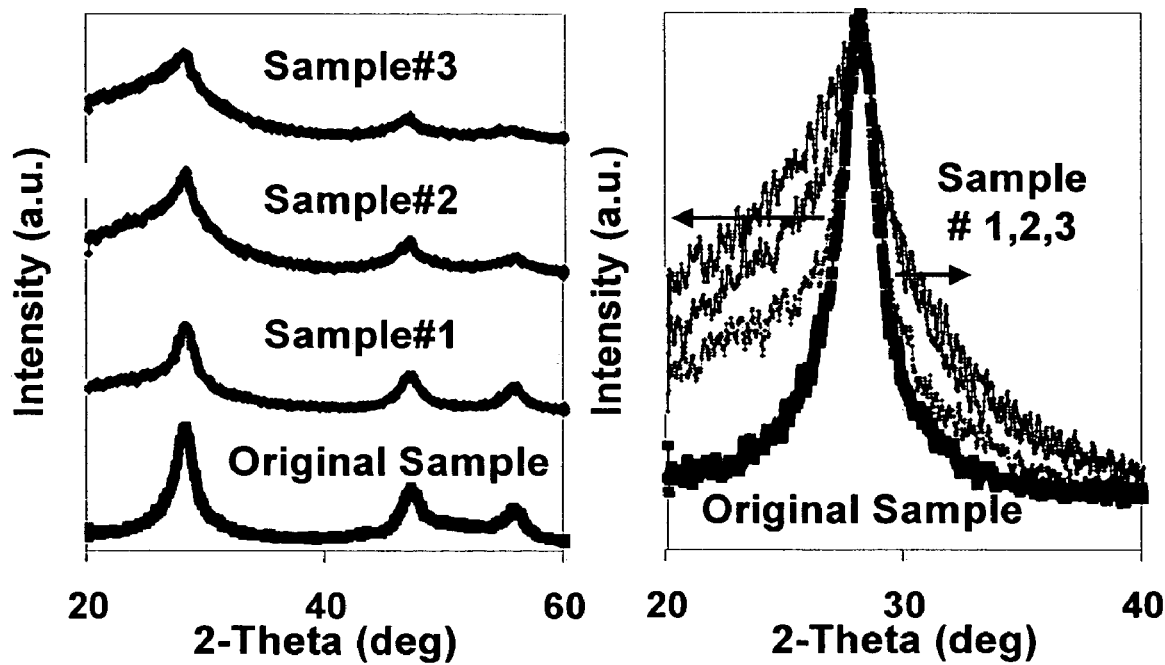
FIG. 6A is a graphic representation of powder XRD patterns of original and etched silicon nanoparticles (simply called sample #1, 2, and 3). For sample #1, 2 and 3, the peak PL emission wavelengths are 700, 650 and 630 nm, respectively.
FIG. 6B is a graphic representation of normalized XRD peaks at 28.3 degrees for the four samples.

FIG. 6 shows XRD results for the original, non-luminescent particles and luminescent particles with PL peaks centered at 700 (sample #1), 650 (sample #2), and 630 nm (sample #3). The original and etched samples were all from the same batch of unetched particles. From FIG. 6A, the original sample and all three different etched samples show peaks characteristic of crystalline silicon at 2θ values of ~28.3, 47.2, and 56.0 degrees. These results confirm that crystalline silicon is present in both original and etched, luminescent particles.

Considering the details of the peak centered at ~28.3 degrees, it is seen that particles with broader XRD peaks have shorter PL wavelength (FIG. 6B). If the PL of the etched particles is size-dependent, particles with shorter PL peak wavelength should be smaller. XRD results support this hypothesis. For particles in this size range (less than 10 nm) substantial broadening of the XRD peaks due to finite size effects is expected. The degree of broadening depends on strain and possibly other factors as well as particle size. These particles are expected to be highly strained, due to the presence of a silicon dioxide ($SiO_2$) shell on their surface. Therefore, the Scherrer formula cannot reliably be used to determine the particle size. However, the trend of increased broadening of the XRD peaks with increasing etching time and decreasing PL wavelength supports the interpretation that the particle size is decreasing with increasing etching time and this shifts the emission wavelength toward the blue.

Figure 7:
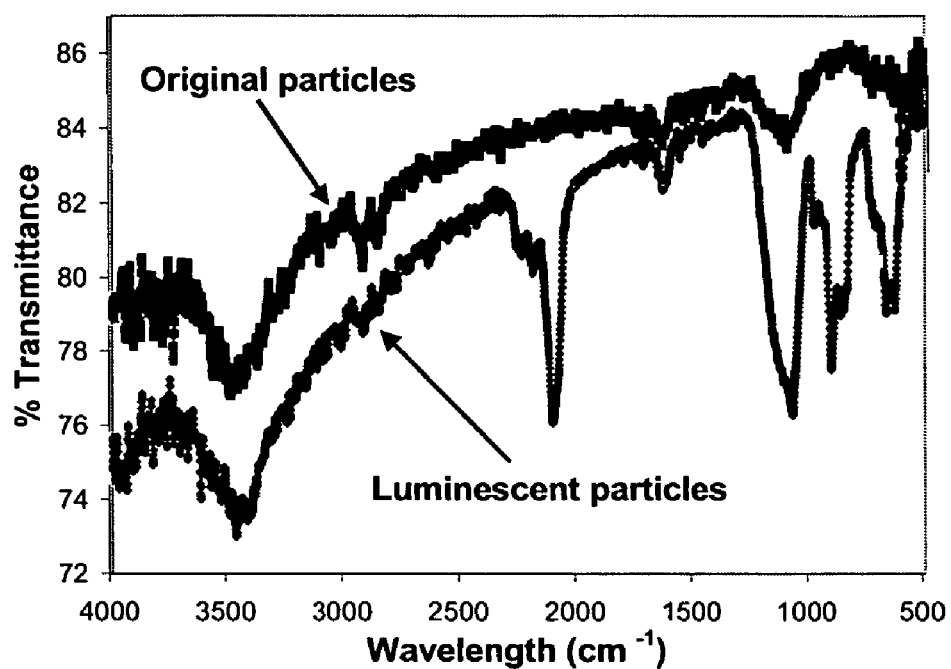
FIG. 7 is a graphic representation of FTIR spectra for original and etched Si particles. The etched particles were washed with 5% HF solution.

FIG. 7 shows FTIR spectra for the same sample before and after being etched and washed with 5% HF solution (etched sample #1 from FIGS. 6A and 6B). For both the original and etched samples, there are peaks at ~1070 $cm^{-1}$, which correspond to Si—O bonds. After etching, there is a strong peak at ~2108 $cm^1$ for Si—H. For the original sample, there is no peak at this position. For other unetched samples, a weak peak at this Si—H stretching frequency was seen. The Si—O bonds in the original sample presumably come from slow air oxidation, since the particles are prepared in an oxygen-free environment and their as-prepared surfaces could consist of a mixture of H-termination and dangling bonds. Washing with 5% HF as the final step in the etching procedure increased the intensity of the Si—H features, but these features are much larger for etched than unetched samples even without this step. Clearly, the state of the particle surface changes substantially during the etching process. The surface structure of the luminescent samples is qualitatively different from that of the non-luminescent samples. However, the FTIR spectral features do not correlate with the PL emission wavelength. The FTIR spectra for samples #1, 2, and 3 of FIGS. 6A and 6B are essentially identical. The relative intensities of Si—H and Si—O features change with etching conditions ($HNO_3$ to HF ratio) and with post-etching exposure to either HF or $HNO_3$ alone, but they do not change with total etching time for given conditions and procedure.

Figure 8:
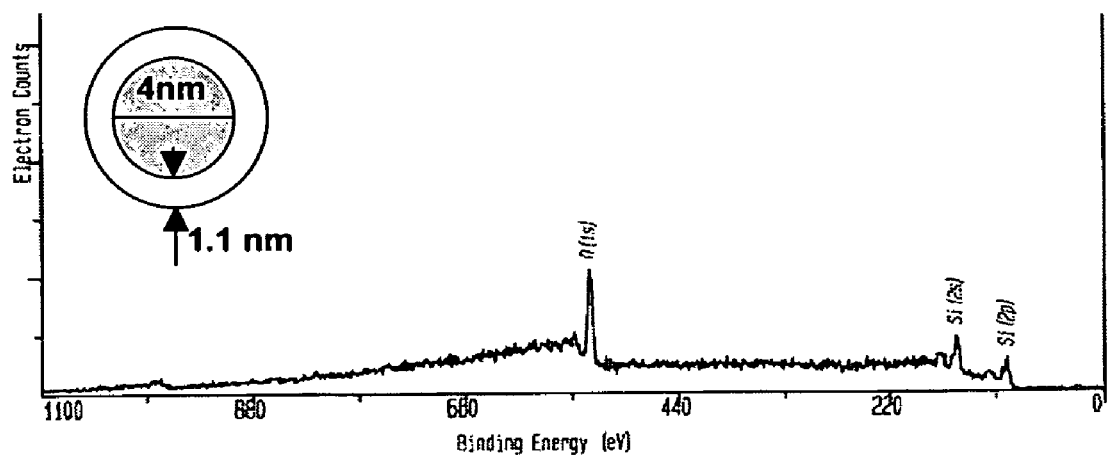
FIG. 8 is a graphic representation of XPS spectrum for luminescent silicon particles. Analysis depth is 2 nm for this sample. The inset picture shows a $Si/SiO_2$ core shell structure consistent with the measured Si to O ratio.

X-ray photoelectron spectroscopy (XPS) was used to determine the elemental composition of the particles. FIG. 8 shows the XPS spectrum for the etched sample #1 (FIGS. 6A and 6B) after exposure to air for 10 days. The XPS spectrum shows peaks only for silicon and oxygen. The atomic percent concentration ratio of Si and O is 45.3:54.7. This ratio can be used to calculate a volume ratio of $SiO_2$ to silicon of 3.45:1 within the 2 nm analysis depth of the experiment (assuming a density of 2.2 $g/cm^3$ for $SiO_2$ and 2.33 $g/cm^3$ for Si). The inset shows a Si/$SiO_2$ core shell structure consistent with the measured Si and O ratio. If the particles have a spherical core-shell structure with a crystalline silicon core diameter of 4 nm, then this ratio corresponds to an oxide shell about 1.1 nm thick. This degree of oxidation is reasonable for a sample that has been exposed to air for 10 days. Results were similar for sample #2 (FIGS. 6A and 6B), which had a lower Si to O ratio of 43:57, consistent with a slightly smaller core size or slightly thicker oxide shell. This is consistent with the fact that sample #2 emitted at a shorter wavelength (peak at 650 nm) than sample #1 (peak at 700 nm). Thus, XPS results also support the hypothesis that emission wavelength decreases with decreasing particle size. Furthermore, the XPS elemental analysis is consistent with the picture of Si core/$SiO_2$ shell structures of approximately the size expected.

Example 6

Production of Blue-Emitting Nanoparticles by Rapid Thermal Oxidation

Blue-emitting particles are produced by rapid thermal oxidization (RTO) of particles that have peak emission in the orange before RTO. This was done by dispersing the etched particles in chloroform, which was then evaporated under dynamic vacuum with heating to 400° C. Particles were then exposed to air for a short time (~1 minute), still at 400° C. They were then cooled under dynamic vacuum.

Figure 9:
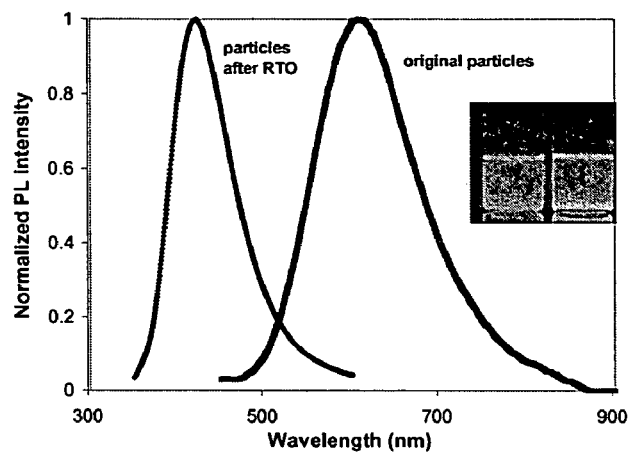
FIG. 9 is a graphic representation of normalized PL spectrum of blue-emitting nanoparticles and of the orange-emitting nanoparticles from which the blue-emitting particles were prepared. The inset shows chloroform dispersions of particles before and after rapid thermal oxidation, with UV illumination from below.

FIG. 9 shows the results of this rapid thermal oxidization procedure. The inset shows chloroform dispersions of particles before and after rapid thermal oxidation, with UV illumination from below. For particles with original peak emission around 650 nm, after rapid thermal oxidization the peak emission shifted to 420 nm. The color change from orange to blue was accompanied by a slight increase in emission intensity. This process presumably causes the surface oxide layer on the particles to grow at the expense of the silicon core, decreasing the core size and shifting the emission wavelength toward the blue. However, the mechanism of this emission is far from understood. In many cases, blue emission from Si particles is attributed to silicon sub-oxides, and this may also be the case here. This emission is not present if the particles are oxidized completely (at higher temperature or for longer times) to yield $SiO_2$ nanoparticles. Producing blue-emitting particles thus provides PL emission spanning the entire visible spectrum, with comparable brightness for a range of wavelengths. The composition, crystallinity and other properties of these blue-emitting particles, may be determined as has been described above for the red-emitting particles.

Example 7

Stability of Silicon Nanoparticle Photoluminescence

Figure 10A:
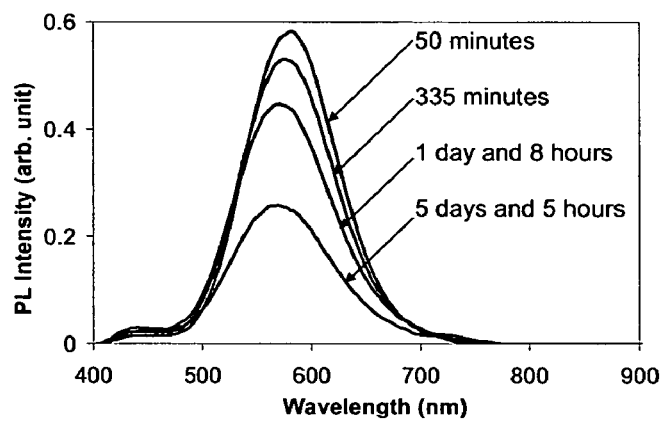
FIGS. 10A and 10B are graphic representations of change in PL spectrum after initial etching to produce luminescent particles.

A very important factor in the ultimate utility of these particles in applications and in investigations of their surface chemistry is the long-term stability of their optical properties. Lack of PL stability has significantly hampered applications of luminescent porous silicon. Stability of the PL from the particles produced according to the present invention is generally consistent with observations on porous Si. FIG. 10 shows the time dependence of the PL spectrum of dispersions of silicon nanoparticles in methanol and water. For the methanol dispersion shown in FIG. 10A, the peak PL intensity dropped by a factor of 2.5 and the peak position shifted by about 12 nm toward the blue during the first 125 hours after etching. A general trend seems to be that particles with initial emission at longer wavelengths show an initial increase in PL intensity with time, followed by a decrease in intensity at longer times, while particles with shorter wavelength emission show a monotonic decrease in PL intensity with time. However, this is not universally true for all samples, and the time evolution of the PL after etching continues to be investigated. For water dispersions, the changes tend to be even larger.

Figure 10B:
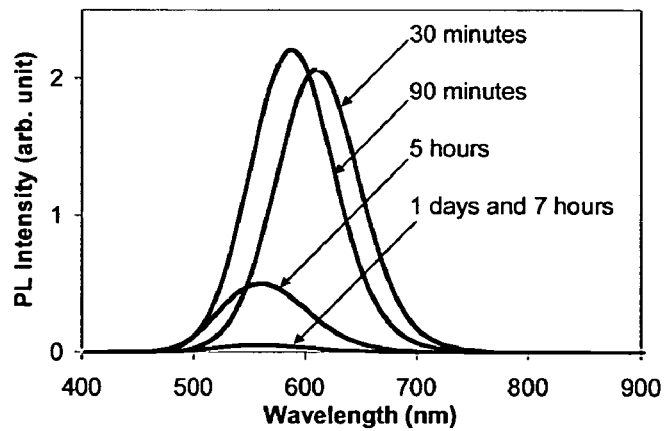

For the sample shown in FIG. 10B, the peak position shifted by almost 50 nm toward the blue and the intensity decreased by almost an order of magnitude during the first 31 hours after preparation. The only powder sample which exhibited a significant change with time was one with an initial peak PL at 506 nm, which moved toward the red by about 40 nm during the first 2 days after preparation. Most of the powder samples have shown no significant change in PL intensity or wavelength after several weeks of storage at room temperature in air, under fluorescent room lighting. The changes in PL intensity and emission wavelength may result from slow (ultimately self-limiting) oxidation of the particles, producing a thicker oxide layer and smaller core diameter, or may result from other changes in the state of the particle surface. The mechanism of luminescence in these particles is not yet firmly established, and therefore the source(s) of changes in it are only speculative. Surface treatment of the particles to stabilize their photoluminescence properties when dispersed in solvents is considered. It should be emphasized that in the vast majority of samples, the changes in PL intensity described above have not led to a total loss of visible PL from the particles. Many samples, after many months of storage in air at room temperature exposed to room light, still show PL emission that is clearly visible to the unaided eye when excited by a 4-watt handheld UV lamp.

Example 8

Stabilizing Photoluminescence of Silicon Nanoparticles by Wet Oxidation

Figure 11A:
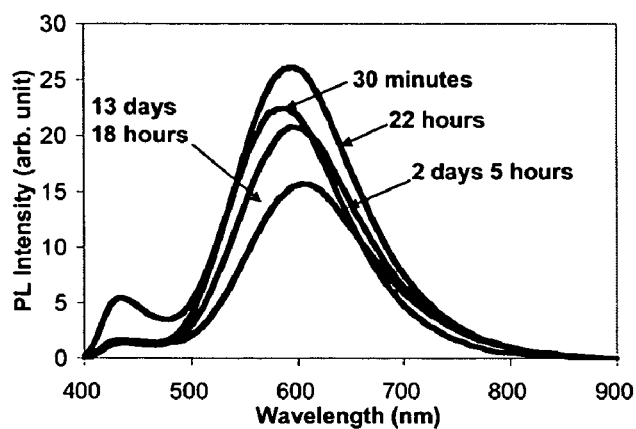
FIGS. 11A and 11B are graphic representations time dependence of PL spectrum from silicon nanoparticles dispersed in chloroform after etching. The particles represented in FIG. 11A were washed for 1.5 minutes with 30% $HNO_3$ at the end of the etching procedure, while those represented in FIG. 11B were not. Note that the intensities cannot be compared directly between the two samples, due to differences in particle concentration, etc., but they can be compared quantitatively for the same sample at different times.
Figure 11B:
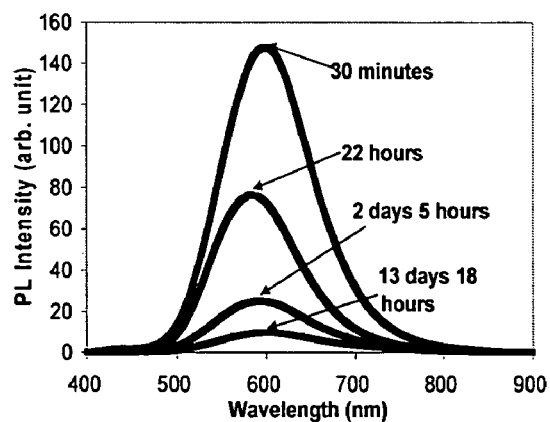

One means of stabilizing the PL from these nanoparticles is surface oxidization using $HNO_3$ or another oxidizer in solution. Chemical oxidation of Si nanoparticles may provide a high quality, chemically inert, and relatively impermeable $SiO_2$ layer on the particle surface and therefore stabilize the emission by preventing further changes in the state of the particle surface. Initial results from this approach are quite promising. FIGS. 11A and 11B show the PL from particles treated with 30% $HNO_3$ for 1.5 minutes immediately after etching (FIG. 11A), along with that from untreated particles (FIG. 11B). After about 13 days, the untreated particles in chloroform retained only about 6.5% of their initial emission intensity, while the particles oxidized with $HNO_3$ retained about 71% of their initial intensity. The intensities cannot be compared directly between the two samples, due to differences in particle concentration, etc., but they can be compared quantitatively for the same sample at different times.

Example 9

Stability of Colloidal Dispersion of Silicon Nanoparticles

Furthermore, the dispersions shown in FIGS. 4A and 4B are not truly stable colloidal dispersions. While the particles are easily dispersed into water, methanol, and other small alcohols after etching by shaking or mild sonication, they visibly agglomerate and partially settle out of these solvents over a period of several hours to several days at room temperature, and a period of minutes to a few hours at 80° C. By contrast, dispersions in 1,4-butanediol, 1,2-propanediol, and glycerol appear to be truly stable colloidal dispersions. These do not visibly agglomerate overnight at 80° C. or during several weeks of storage at room temperature. Quantitative measurements of degree of agglomeration (for example using laser light scattering) have not been performed, but there is a clear qualitative difference between the dispersions that remain clear and those in which agglomeration occurs. Work to modify the particles' surfaces not only to stabilize the PL, but also to make them more readily dispersable in a wider range of solvents is described below. The chemistry of both Si and $SiO_2$ surfaces has been extensively studied, and known strategies such as hydrosilylation of Si and reaction of alkoxysilanes with $SiO_2$ to functionalize the particle surfaces can be used. The ability to rapidly produce macroscopic samples of luminescent Si nanoparticles is allowing a large number of potential reagents to be screened. This has often not been possible with Si nanoparticles produced in much smaller quantities by other methods.

Example 10

Surface Functionalization of Luminescent Silicon Nanoparticles

Surface modification of etched, luminescent silicon nanoparticles offers interesting scientific and technological possibilities because it allows the formation of stable colloidal dispersions of these particles that can be handled and manipulated like ordinary chemical reagents. The PL of the treated particles was visually observed using a handheld UV lamp (Black-Ray ultraviolet lamp, model B100SP) and recorded using a Perkin-Elmer (Newark, Conn., USA) LS 50 fluorescence spectrometer with a 351 nm bandpass filter used to suppress any scattered light from the source. The surface properties of functionalized particles were analyzed by Fourier transform infrared (FTIR) spectroscopy using a Mattson Galaxy series FTIR 5000. Powder samples were mixed with KBr to prepare thin pellets for FTIR measurements. For particle dispersions, membrane dialysis was first performed to remove excess reagents, and then the solvent was evaporated. The resulting oily looking particles were mixed with KBr to make pellets for FTIR measurements. For liquid samples, FTIR measurements were conducted in the horizontal attenuated reflectance mode of the spectrometer by casting a drop on the internal reflection element card. High resolution TEM (JEOL-JEM 2010) and selected area electron diffraction were used to obtain information on crystalline lattice spacing, particle size, and degree of agglomeration of the surface treated particles.

Particle treatment following surface functionalization included dialysis using a 12-14 kD cut-off regenerated cellulose membrane (Spectrum Laboratories, Inc., Rancho Dominguez, Calif., USA) against an appropriate solvent to remove excess reagents. The solution outside the dialysis membrane usually showed weak PL under UV illumination, indicating that some small particles could pass through this membrane. Unreacted alkenes were removed by size exclusion chromatography of surface treated particles in a column (9"×¾") packed with Bio-beads S-X1 (Bio-Rad Laboratories, Hercules, Calif., USA). These beads have a molecular cutoff limit of ~14 kD. Small molecules such as octadecene, with a molecular weight of 252 Daltons, enter the pores of the beads and move through the column more slowly than the particles, which cannot enter the pores. Under continuous flow of solvent, particles can be tracked through the glass column by illuminating it with a UV lamp. It took about 30 to 40 minutes for typical red to orange emitting particles to pass through the column.

Chemicals used in these experiments were: sulfuric acid ($H_2SO_4$) (Aldrich Chemical Co., Inc., Milwaukee, Wis., USA), 95-97%; hydrogen fluoride (HF), 48.0~51.0%, A.C.S reagent grade; nitric acid ($HNO_3$) (EMD Chemicals, Gibbstown, N.J., USA), 68.0~70.0% GR grade; methanol (MEOH) (EMD Chemicals, Gibbstown, N.J., USA), HPLC grade; toluene (Aldrich Chemical Co., Inc., Milwaukee, Wis., USA), 99.0%; ethyl alcohol (Pharmco Products, Inc., Brookfield, Conn., USA) 200 proof, ACS/USP grade, 190 proof ethyl alcohol and HPLC grade ethyl alcohol were also used for some experiments; octadecene (Acros Organics, Geel, BE), 90%; undecylenic acid (Acros Organics, Geel, BE), 99%; hydrogen peroxide ($H_2O_2$) (Acros Organics, Geel, BE), 30%; potassium bromide (KBr) (Acros Organics, Geel, BE), IR grade, 99+%; octadecyltrimethoxysilane (Aldrich Chemical Co., Inc., Milwaukee, Wis., USA), 90%. All chemicals were used without further purification.

Example 11

Hydrosilylation of Nanoparticles with an Si—H surface

Preparation of Si—H terminated nanoparticle surfaces took advantages of the known reactions of aqueous hydrogen fluoride (HF) solution with silicon. On flat silicon wafers, it is easy to generate Si—H surfaces with excellent chemical homogeneity (>99% H termination) with aqueous HF solution or degassed 40% aqueous $NH_4F$ solution. Higashi et al., *J. Appl. Phys. Lett.* 58:1656 (1991); Higashi et al., *J. Appl. Phys. Lett.* 1656 (1990), which are hereby incorporated by reference in their entirety. The strong FTIR stretching modes at ~2100 cm$^{-1}$ provide clear information on the state of the particle surface before and after surface functionalization. The same methods were used to produce Si—H nanoparticle surfaces. Subsequent surface functionalization of the Si—H surface was based on thermally induced hydrosilylation. At sufficiently high temperature, some Si—H homolytic cleavage occurs:

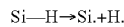

These silicon based radicals (dangling bonds) will then react with alkenes via the following free-radical chain mechanism (Labinger, *Comprehensive Organic Synthesis* 8:699 (1991):

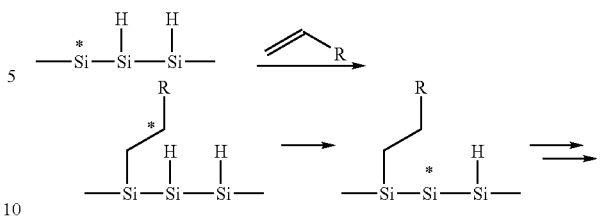

Silicon nanoparticles were produced by laser pyrolysis of silane followed by $HF/HNO_3$ etching as described above. The resulting particles were washed with DI water and methanol several times on a polyvinylidene fluoride (PVDF) membrane filter (Millipore, Billerica, Mass., USA) to remove excess HF and $HNO_3$. These particles need to be further surface treated to generate the Si—H terminated surface. An aqueous 5% HF solution was used for this purpose. Particles, still deposited on the filter paper, were transferred to a container containing 5% HF solution and were then sonicated for 5 minutes to remove particles from the filter paper, break up agglomerates, and promote mixing. The resulting particles were then filtered and again washed thoroughly with DI water and methanol. For most experiments (typically 100 mg original unetched particles), about 20 to 50% of the original mass of unetched particles as recovered after the entire etching and HF wash process. Particles were then transferred to a small flask and dispersed in the solvent to be used for the functionalization reaction. All solvents were bubbled with pure nitrogen for at least 30 minutes to remove dissolved oxygen. A sonicator (Branson 2510, VWR Scientific Inc., San Francisco, Calif., USA) was used to disperse particles from the filter paper. A small amount of particles was always left untreated, for comparison to the treated particles. The particle solution was mixed with additional solvent to yield a final volume of about 15 ml. The dilute particle solution was transferred into a flat bottom flask. For preparing octadecene-coated particles, 2 ml of octadecene was added to the solution and it was sonicated for 15 minutes. The solution was then refluxed with stirring at the solvent boiling point (~110° C. for toluene) overnight. After some time, the particle dispersion became less turbid. The solution typically becomes completely clear in a few hours to 20 hours. The clear, well-dispersed particle solution can pass through filter paper with 0.1 μm pore size easily, indicating that surface modification effectively changed the dispersability of particles in the solvent used. When the etched particles were treated with undecylenic acid, the solvent was changed to ethanol. The surface treatment process otherwise proceeded in the same way as described above for octadecene in toluene.

Example 12

Silanization of Si—OH Surface

This surface functionalization method uses silane coupling agent chemistry and requires a Si—OH terminated surface. The general formula for an organosilane is $R_n SiX_{(4-n)}$, where X is a hydrolyzable group that is typically alkoxy, acyloxy, amine or chlorine. When reacted with the Si—OH surface, each Si—X bond is replaced by a Si—O bond to the surface or to another organosilane molecule. In the work described here, X is methoxy, which gives methanol as the by-product when reacted with the silicon surface.

Silanes are available with a wide variety of functional groups (R), which makes this a potentially versatile route for particle functionalization.

To generate Si—OH terminated surfaces, two different methods were used. The simplest method was to wash the etched particles directly with 20% nitric acid for a few minutes and then wash them thoroughly with DI water. The second one was to wash the etched particles with concentrated sulfuric acid and 30% hydrogen-peroxide (7:3 by volume, also called 'piranha etch'). Note that extreme care should be taken with this reagent mixture since there is high risk of explosion or fire if it comes in contact with reducing agents, and it is also highly corrosive. The second method can generate a more uniform Si—OH surface but if the first method is also effective, then it is preferable because it avoids the use of the hazardous sulfuric acid/hydrogen peroxide mixture.

There are several methods of depositing organosilanes on hydroxyl terminated silicon surfaces. In the work describe here, the organosilane was deposited from aqueous alcohol. This approach is appropriate for alkoxysilanes like that used here. For the more reactive chlorosilanes, a dry nonpolar solvent like toluene is used. For coating the particles with octadecyltrimethoxysilane, a 5% water in ethanol solution was first adjusted to pH 4.5-5.5 with acetic acid. Octadecyltrimethoxysilane was added with stirring to yield ~2 (wt) % final solution. At least five minutes was allowed for hydrolysis and silanol formation. The etched particles, treated as described above to give an —OH terminated surface, were sonicated in ethanol separately, then mixed with the above 2% silane solution and sonicated again to promote dispersion of the particles. The resulting solution was refluxed in a flask with a condenser for about one hour. Then the solvent in the flask was evaporated until the volume was reduced to about half of the original volume. A volume of toluene equal to one to two times the volume of the remaining solution was added, and the mixture was refluxed with vigorous stirring for an additional 10 to 20 hours. The result was a clear yellow dispersion that emitted brightly under illumination by a handheld UV lamp. The final particle dispersion could pass through a piece of 0.1 μm filter paper with minimal loss of PL intensity and no change in color. Removal of excess organosilane was again achieved by membrane dialysis.

Example 13

Preparation of Stable Colloidal Dispersions of Silicon Nanoparticles by Surface Functionalization With Octadecene In order to make a truly thermodynamically stable dispersion of the etched Si nanoparticles, their surface must be adequately passivated. The hydrogen terminated Si particle surface is unstable, both toward slow oxidation by air and toward particle agglomeration in most solvents. Oxide-passivated surfaces are similarly unstable to agglomeration in most solvents and can suffer from further oxidation, which alters the photoluminescence spectrum. The approach recently described on surface alkylation by Lie et al. (*J. Electroanalytical Chem.* 538-539:183-190 (2002), which is hereby incorporated by reference in its entirety) has proven to be an effective method of rendering stability to the particles in nonpolar solvents like toluene. These authors reacted different alkenes with the surface of luminescent silicon nanoparticles (produced by sonication of porous silicon) by refluxing the nanoparticles in toluene solutions of the alkenes. Such hydrosilylation reactions on porous silicon and on hydrogen terminated silicon wafers are described by Buriak (*Chem. Rev.* 102:1271-1308 (2002), which is hereby incorporated by reference in its entirety).

Figures 12A, 12B:
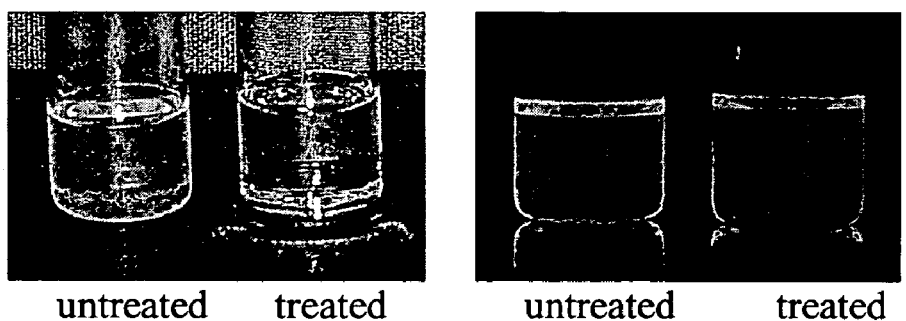
FIGS. 12A and 12B show untreated and octadecene treated samples under room illumination (FIG. 12A) and UV illumination (FIG. 12B).

Following the methods described above, powder samples and octadecene were refluxed in toluene. This gave yellowish but clear and photoluminescent dispersions of silicon particles in toluene that remained clear for several months to one year. FIGS. 12A and 12B show octadecene-treated and untreated samples under room illumination (FIG. 12A) and UV illumination (FIG. 12B). It is clear from FIGS. 12A and 12B that before octadecene surface treatment, the particle dispersion was cloudy. After surface treatment, the particle solution was clear and emitted very evenly. The color difference between the two emitting samples results from the fact that these pictures were taken several weeks after the surface treatment was carried out, and the PL from untreated samples blue shifts over time, while that from the treated samples does not. FIGS. 13A and 13B show TEM images of octadecene-treated silicon nanoparticles. The TEM images show individual particles less than 10 nm in diameter, as well as some larger particles that may be clusters of 2, 3, or 4 primary particles. The particles are well separated, indicating that particles in solution do not agglomerate significantly, even during solvent evaporation from the TEM grid. From the high-resolution pictures in FIGS. 13A and 13B, it is seen that the etched particles kept their crystalline structure, with a crystal lattice spacing of ~3.2 Å, roughly the same as that of bulk silicon. The shape of etched particles is somewhat irregular.

Figure 15:
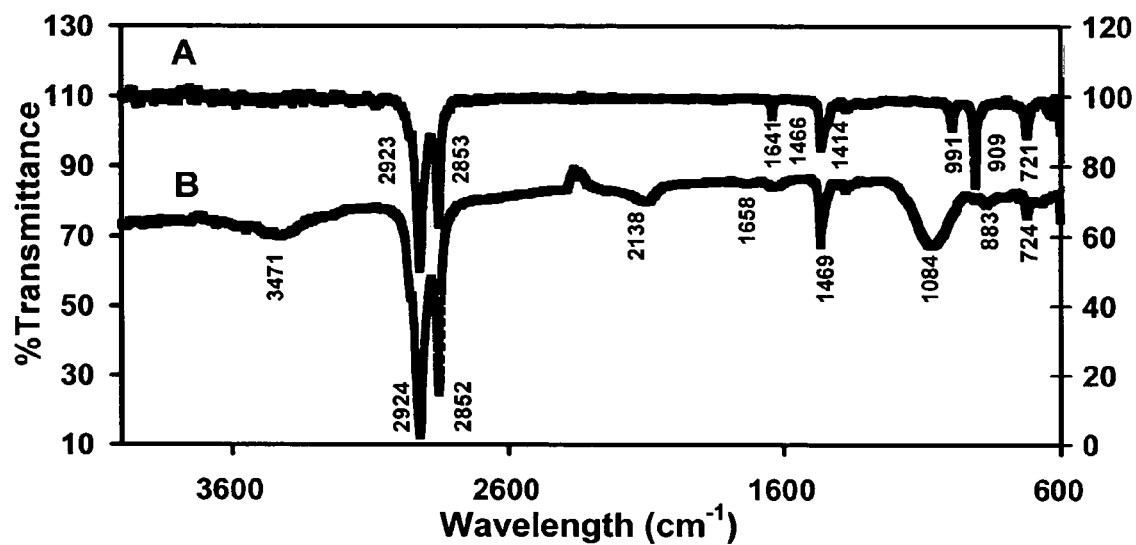
FIG. 15 is a graphic representation of FTIR spectra for pure octadecene (A) and etched, octadecene surface-coated particles (B).

The hydrosilylation reaction between the double bond in octadecene and the Si—H surface bond is evidenced by the FTIR absorption spectrum of the etched particles compared to the alkylated particles. For these measurements, excess octadecene was removed by dialysis after refluxing. FIG. 14 shows FTIR spectra for untreated, etched particles and particles that were surface treated by octadecene. FIG. 15 shows FTIR spectra of the same surface treated particles and of pure octadecene. Before surface treatment, there is strong peak at 2109 cm$^{-1}$ that arises from Si—H bonds, indicating that particles were mostly Si—H terminated. There are also strong peaks at 1070~1080 cm$^{-1}$, which can be assigned to Si—O, indicating that this surface is not free of oxygen. After refluxing with octadecene, the FTIR spectrum for these particles has peaks characteristic of alkyl C—H$_x$ vibration at 2923, 2852, 1657 and 1468 cm$^{-1}$ that are not present in the untreated sample in FIG. 14. The intensity of the Si—H feature (2108 cm$^{-1}$) decreased significantly in the coated sample as shown in FIG. 14. Comparing the treated sample to neat octadecene in FIG. 15, it is seen that the C=C features (991, 908 cm$^{-1}$) have almost disappeared, while all other spectral features are retained. The above results confirm that the silicon particle surfaces have been coated covalently and Si—C bonds are formed (which should appear at ~1083 cm$^{-1}$, overlapping with features due to Si—O bonds that are inevitably present). When particles were treated with octadecene, there was little or no shift in the PL spectrum from before to after treatment.

Example 14

Surface Functionalization of Si Nanoparticles by Undecylenic Acid

By using undecylenic acid instead of octadecene, it was possible to get a clear dispersion of the nanoparticles in a semi-polar solvent such as ethanol. After refluxing with undecylenic acid in ethanol, a clear, yellowish dispersion was obtained that could pass through 0.1 μm filter paper without loss of color or photoluminescence. In most cases there was a blue shift in the PL spectrum from before to after surface treatment. This suggests that some oxidation may be occurring during surface treatment. With undecylenic acid bound to the surface, it was possible to obtain an aqueous dispersion of the particles, but the clarity lasted only for a few days and eventually some turbidity developed.

Figure 16:
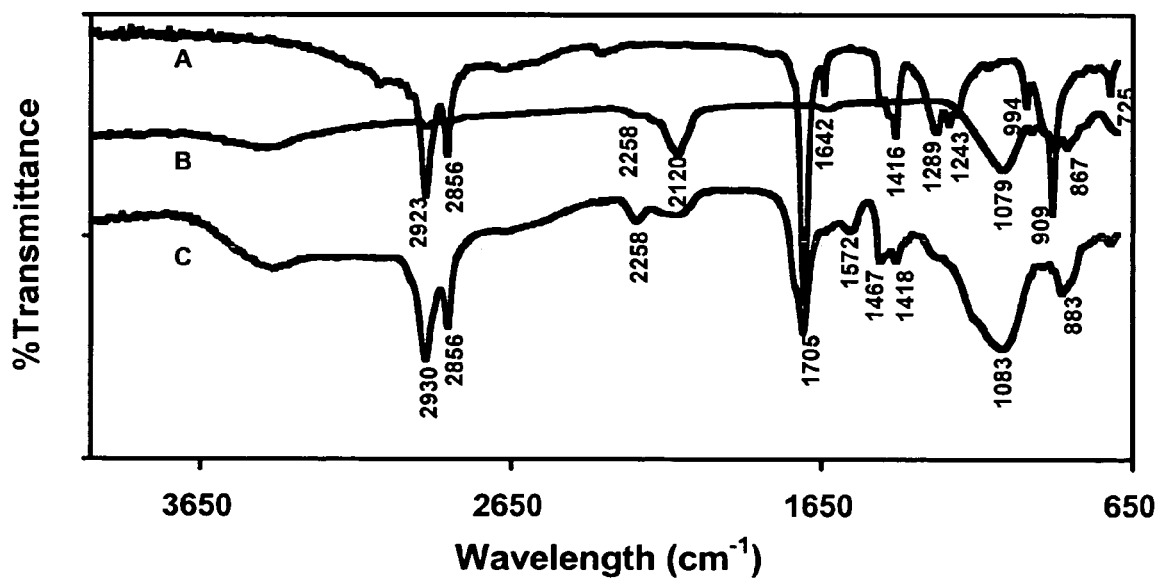
FIG. 16 is a graphic representation of FTIR spectra for pure undecylenic acid (A), etched particles (B), and undecylenic acid treated particles (C).

FIG. 16 shows FTIR spectra for etched (but untreated) particles, undecylenic acid treated particles, and pure undecylenic acid. Strong peaks for alkyl C—H vibration at 2922, 2856 and 1467 cm$^{-1}$ appear after treatment with undecylenic acid, along with a peak corresponding to the COOH group at 1704 cm$^{-1}$. Comparing the treated particles to neat undecylenic acid, peaks at 908.8 and 994.4 cm$^{-1}$ for C=C double bond vibration are almost completely missing from the treated particles. Similarly, the peaks for Si—H bonds at 2119-2258 cm$^{-1}$ are much weaker in the treated particles than in the untreated particles. Again, this provides clear evidence of the expected hydrosilylation reaction. The shift of the Si—H peak from predominantly a peak at 2120 cm$^{-1}$ to 2258 cm$^{-1}$ suggests that the remaining Si—H bonds are of the O—Si—H variety. This, in turn, further supports the hypothesis that surface oxidation occurs during the refluxing in ethanol.

Example 15

Surface Functionalization of Si Nanoparticles by Organosilanes

Because there are many commercially available organosilanes with various functional groups, surface functionalization of Si nanoparticles by silanization provides an attractive means of preparing the nanoparticles for linking with other materials via these functional groups. After production of etched particles with visible PL, these particles need to be surface treated to produce an Si—OH terminated surface that can react with organosilanes. This was done by washing particles with 20% HNO$_3$, or by washing them with concentrated sulfuric acid and hydrogen peroxide. Both methods provide a Si—OH terminated surface upon which silanization reactions could be carried out. After refluxing the particles with octadecyltrimethoxysilane in toluene, a clear, yellowish particle solution was obtained that emitted brightly under UV illumination and that passed through 0.1 μm filter paper with minimal loss of color or PL. This particle dispersion was also very stable and remains clear and photoluminescent after several months.

Figure 17:
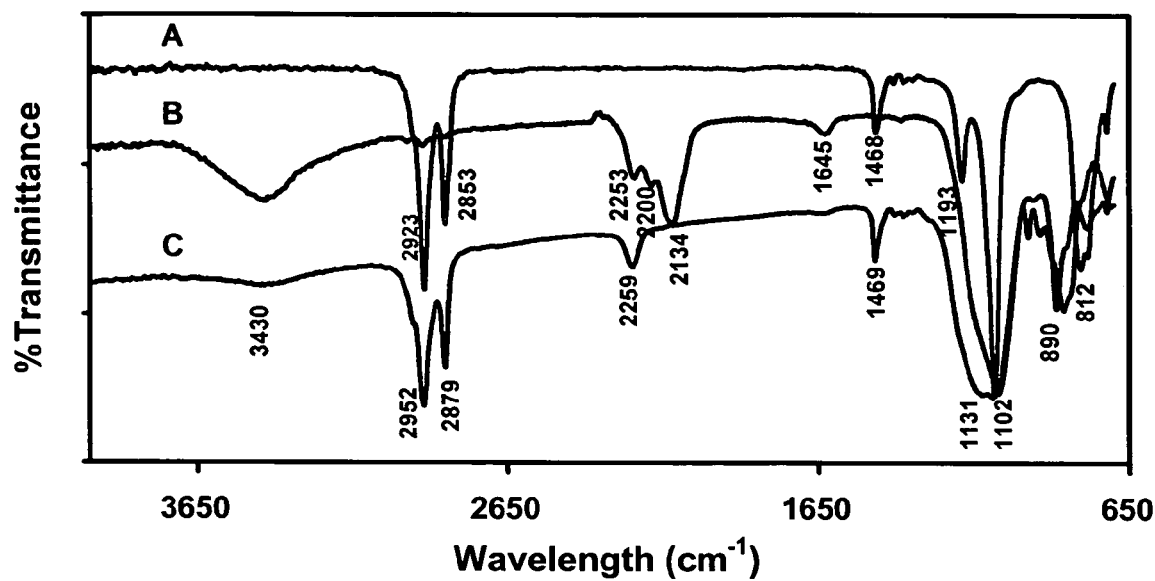
FIG. 17 is a graphic representation of FTIR spectra for pure octadecyltrimethoxysilane (A), etched silicon particles after washing with 20% $HNO_3$ (B), and silicon nanoparticles coated by octadecyltrimethoxysilane in toluene (C).

FTIR spectra were again applied to explore the surface state of the silicon particles before and after surface modification. FIG. 17 shows FTIR spectra for silicon nanoparticles coated by octadecyltrirethoxysilane in toluene, etched silicon particles after washing with 20% HNO$_3$, and pure octadecyltrimethoxysilane. After surface treatment with octadecyltrimethoxysilane, an 18-member hydrocarbon chain attached to silicon surface by Si—O—Si— bonds was expected. As shown in FIG. 17, the surface of the etched, HNO$_3$ washed silicon particles is a mixture of Si—OH (or Si—O—) and Si—H, as indicated by peaks at 3429, 1102 cm$^{-1}$ (Si—OH and Si—O), and 2133~2253 cm$^{-1}$ (Si—H). After surface treatment, strong peaks corresponding to hydrocarbon chain vibrations at 2879, 2952 and 1467 cm$^{-1}$ appear. The Si—H peak is lower but still present. The Si—OH feature at 3429 cm$^{-1}$ has significantly decreased. This is presumably because of the Si—OH groups have been converted to Si—O—Si. However, there may be a possibility that water makes a significant contribution to the 3429 cm$^{-1}$ peak, since measurements were made in KBr pellets in air, and KBr is somewhat hygroscopic. The peaks at 1102~1130 cm$^{-1}$ are the joint contribution of Si—O—Si and Si—C. Again, these results suggest that the silane used in this section attached to silicon surface covalently.

Similar experiments were performed using the particles that had been treated with a sulfuric acid/hydrogen peroxide mixture (Pirhana etch). The results were almost identical to those using the HNO$_3$ treated particles. Although the Pirhana etch appears to create a more uniform —OH terminated surface, it did not seem to provide for any greater degree of coating of the surface with octadecyltrimethoxysilane. If anything, it seemed that the Pirhana-etch treated particles were slightly less effectively coated with octadecyltrimethoxysilane than the HNO$_3$-treated particles. In a separate study, the Pirhana-etch treated surface was used with bromopropyltrichlorosilane and it was found to be very effective in that case. Li et al., *Langmuir* 20:1963-1971 (2004), which is hereby incorporated by reference in its entirety.

Example 16

Study of Dependence of Si—H Coverage on Surface Treatment

Although it is well known that for silicon wafers, an Si—H terminated surface can be generated easily by treatment with aqueous HF or NH$_4$F, it is still not clear how aqueous HF affects the surface state of silicon nanoparticles. In order to optimize the reaction conditions to achieve better Si—H coverage on the silicon particle surface, preliminary experiments were conducted to explore the effects of HF concentration on Si—H coverage. Although it is inevitable that there will be some surface oxidation when surface treatments and FTIR measurements are carried out in air, it is expected that more complete coverage of Si—H will benefit the reaction of alkenes on the silicon surface and provide for more complete hydrocarbon coverage of the surface.

Figure 18:
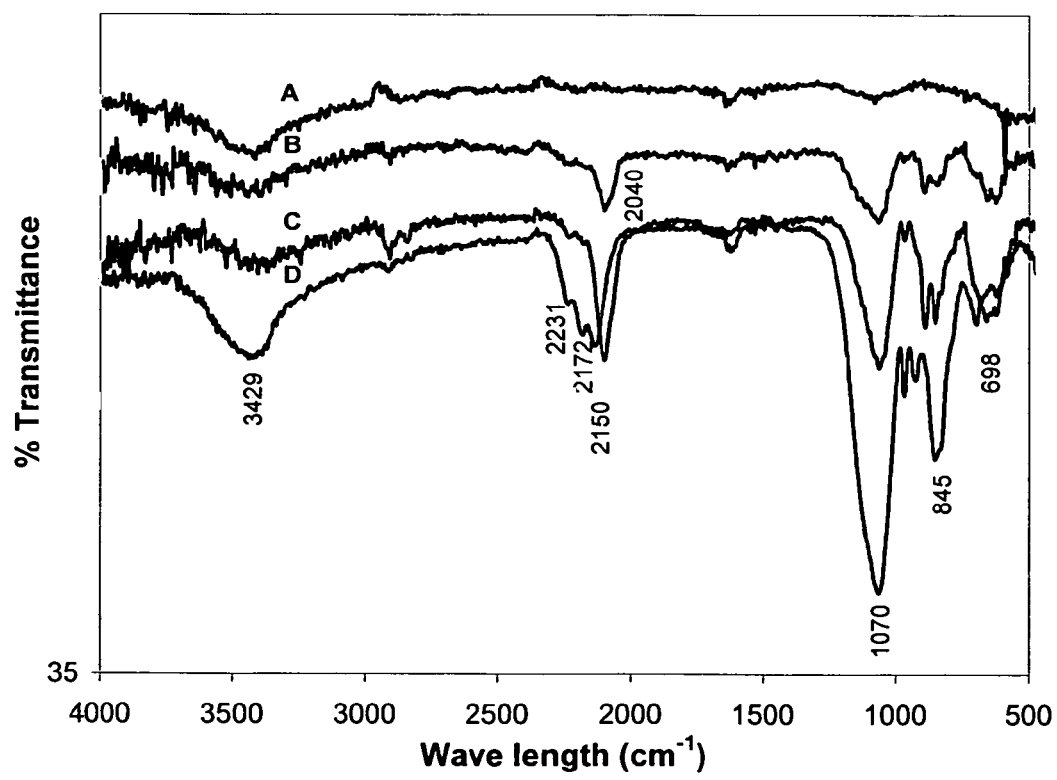
FIG. 18 is a graphic representation of FTIR spectra for dependence of Si—H on HF concentration: original particle surface (A), particle surface washed by 3% HF (B), 5% HF (C), and 15% HF (D).

FIG. 18 shows FTIR spectra for particles washed with 3%, 5%, and 15% aqueous HF solutions. Compared with the original particle surface (before etching), it was found that etched particles possess much stronger FTIR peaks. After washing with HF, all silicon surfaces show strong Si—H stretching modes at 2040~2231 cm$^{-1}$ and Si—O vibrations at ~1070 cm$^{-1}$. Comparing the relative intensities of Si—H and Si—O, it is shown that lower HF concentration tends to produce stronger Si—H vibration peaks. The change in Si—H is substantial between 15% and 5% HF, while there is a smaller difference between samples etched with 5% and 3% HF solutions. Another significant change is that Si—H peak for particles washed with 15% HF is much broader than that of particles washed by 5% and 3% HF solution. This suggests that the Si—H terminated surface generated by 5% and 3% HF is more uniform. The surface produced by 15% HF may contain SiH$_2$ and SiH$_3$ groups for which the frequencies are shifted to higher wavenumber. Wojtyk et al., *Langmuir* 6081-6087 (2002), which is hereby incorporated by reference in its entirety. However, O—Si—H would also produce absorption at similar positions. The broad peak at ~3429 cm$^{-1}$ is assigned to Si—OH or to moisture that has been absorbed by the KBr pellet. The stronger peak at 3429 cm$^{-1}$ for particles washed by 15% HF suggests that this surface also contains more Si—OH than the other samples. From these results it seems clear that a lower HF concentration is preferable for preparing a uniform Si—H surface on the nanoparticles.

Figure 19:
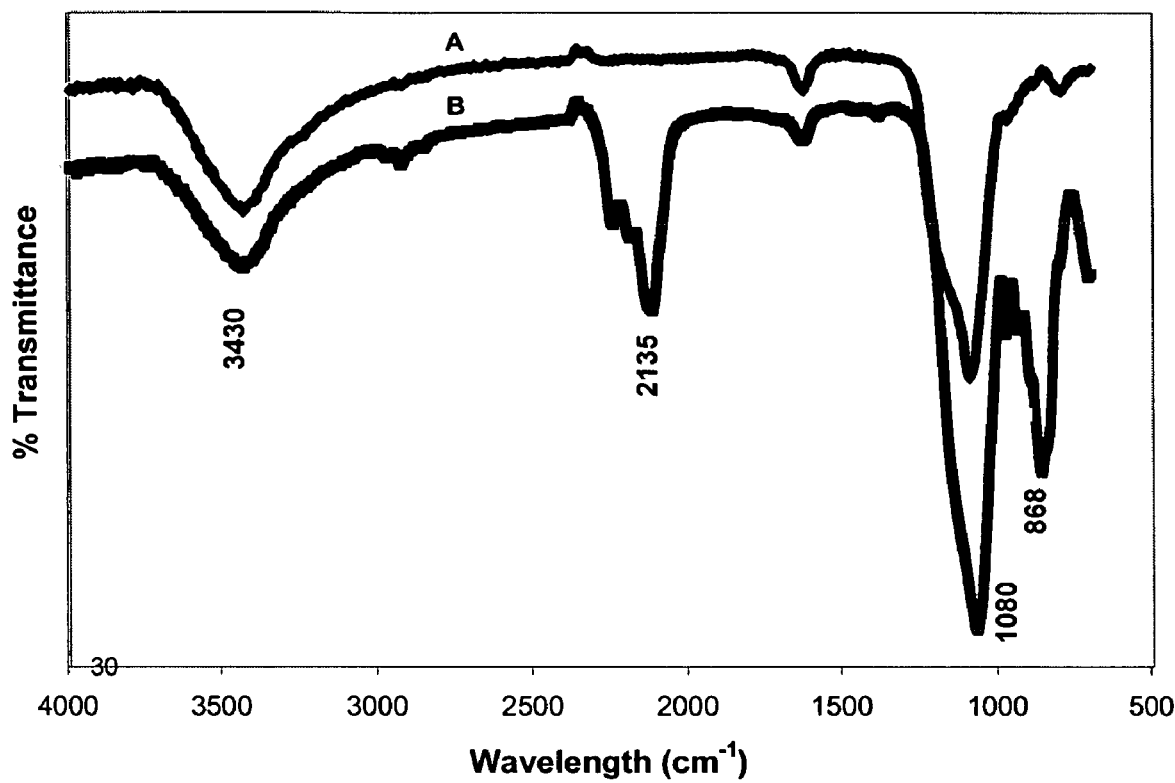
FIG. 19 is a graphic representation of FTIR spectra for particles with Si—OH surface termination generated by concentrated $H_2SO_4$ and $H_2O_2$ (A) and by 20% $HNO_3$ (B).

FIG. 19A shows the FTIR spectrum for etched particles treated with concentrated $H_2SO_4$ and 30% $H_2O_2$ (7:3 by volume) at 90° C. for 30 minutes. Compared with FIG. 18, one significant change is that Si—H features at 2040-2231 $cm^{-1}$ have disappeared almost completely. The large peak at ~1070 $cm^{-1}$ corresponds to Si—O. The strong, broad peak at ~3430 $cm^{-1}$ is assigned to Si—OH though some contribution to this peak may also come from $H_2O$ adsorbed by the KBr pellet during measurement. As a comparison, FIG. 19B shows the FTIR spectrum for nanoparticles washed by 20% $HNO_3$. It is clear that the 2040~2231 $cm^{-1}$ peaks for Si—$H_x$ are still present to some extent, and thus that some Si—H termination remains. These results confirm that the $H_2SO_4$/$H_2O_2$ treatment provides a more uniform Si—OH surface on the nanoparticles than simple washing with $HNO_3$, and thus this treatment will be preferable if extremely dense coating by an organosilane is required, particularly when the surface will be treated with a chlorosilanes rather than an alkoxysilane. Li et al., *Langmuir* 20:1963-1971 (2004), which is hereby incorporated by reference in its entirety.

However, the $HNO_3$ washing did produce a good enough OH termination to allow surface functionalization with octadecyltrimethoxysilane and formation of a stable nanoparticle dispersion in toluene as described in the previous section. As noted above, for the case of octadecyltrimethoxysilane, the $H_2SO_4$/$H_2O_2$ treatment did not provide any improvement in the coating relative to the $HNO_3$ treatment.

Example 17

Stabilization of Photoluminescence by Alkylation

Figure 20A:
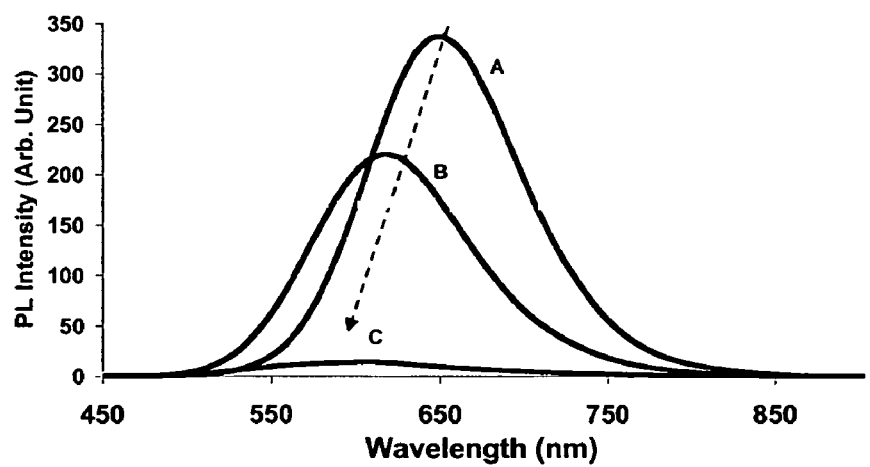
FIG. 20A shows instability of PL spectra of untreated sample, dispersed in toluene (A) stored in air after one day (B) and 12 days (C).

The photoluminescence properties of the alkylated samples were greatly stabilized against degradation. FIG. 20A shows the PL spectra for an untreated, etched sample in toluene. The peak PL intensity (in arbitrary units, but for identical measurements) drops by 35% after one day. The peak PL intensity drops further to only 4% of its initial value after 12 days. There is also a substantial blue shift in PL for this sample, with the peak shifting from 649 nm to 616 nm after one day and then to 606 nm after 12 days. This is likely due to oxidation during storage of the particle dispersion in air.

Figure 20B:
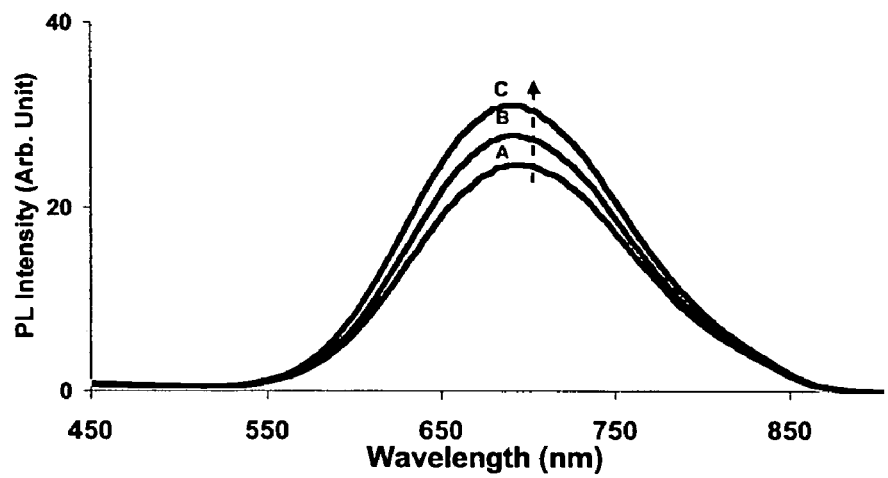
FIG. 20B shows stability of PL spectra of treated (alkylated) sample. Arrows point from before to after storage (A: right after treatment, B: after 35 days, and C: after 60 days). The slight increase in PL intensity for the treated sample is probably due to a small amount of solvent (toluene) evaporation during the 60 days of storage.

FIG. 20B shows the stability of the PL spectrum of a sample that had been treated with octadecene as described above. It was stored in air for 60 days with almost no change in PL intensity and no shift in PL peak position, while the PL spectrum of the untreated sample decreased in intensity by a factor of about 24 and blue-shifted substantially in a time period of only 12 days. Both samples were stored in toluene under identical conditions. There is a slight change in PL position for the treated particles compared to untreated, etched particles. However, after surface treatment, the PL did not show any additional changes. The slight increase in PL intensity of the octadecene-coated sample in FIG. 20B could come from a small amount of solvent evaporation during storage in an ordinary sample vial. Note that neither the absorbance nor concentration has been equalized between the untreated and treated sample, so one cannot compare the absolute magnitudes directly. However, the change for each sample can be compared quantitatively.

The stabilization of PL by the coating is attributed to the covalent passivation of the surface by the hydrocarbon, which prevents oxidation of the nanoparticle surface. Complete stabilization should require that the density of molecules on the surface is sufficient to block transport of oxidizers to the surface. So, the quality of the coating is important in determining the degree of stabilization that can be achieved. The PL of samples treated with undecylenic acid was also stabilized somewhat, but not to the same extent as for octadecene-treated particles. This could reflect a difference in the quality of the coating produced in the two cases, and improved undecylenic acid coatings may eventually provide the same long-term stabilization as octadecene coatings. As described above, it appears that some surface oxidation occurred during the treatment with undecylenic acid, and therefore it may be that the coating is not complete and oxide patches may be present. Additionally, the ethanol used as the solvent for the undecylenic acid coatings may facilitate the oxidation. Even untreated samples generally showed more rapid change in the PL spectrum in alcohols than in nonpolar solvents.

Example 18

Study on Size Selective Precipitation of Coated Silicon Nanoparticles

Size selective precipitation is a well-known technology that has been applied for size-classification of nanoparticle dispersions of materials such as CdS, CdSe, etc. Murray et al., *J. Am. Chem. Soc.* 115:8706-8715 (1993); Murray et al., *Annu. Rev. Mater. Sci.* 30:545-610 (2000), which are hereby incorporated by reference in their entirety. The ability of a solvent to disperse particles is decreased by the addition of a miscible nonsolvent to the point of particle agglomeration. The larger particles agglomerate first as a result of their greater van der Waals attraction to each other. The agglomerated fraction, rich in larger particles, is precipitated under centrifugation, leaving smaller particles dispersed in the solvent. This process is reversible, so the precipitated fraction can be redispersed into the initial solvent. After surface functionalization with octadecene, size-selective precipitation can be applied to these polydisperse silicon nanoparticle samples. Because the PL of these particles is size-dependent, if there is a way to separate particles of different sizes, the PL spectrum may be tuned and narrowed.

For the size-selective precipitation studies, the nanoparticles were coated with octadecene in chloroform rather than in toluene. Dialysis of the clear, well-dispersed particle solution against chloroform was carried out at least twice to remove excess octadecene. Then a few milliliters of this dispersion were transported to a vial to which methanol was slowly added dropwise. At some point particles started to agglomerate and the solution changed from very clear to slightly cloudy. The solution was sonicated for 20 minutes and then centrifuged (Model V centrifuge, VWR Scientific Inc., San Francisco, Calif., USA) at 8000 rpm for 10 minutes to separate the deposit. The solid deposit was redispersed in chloroform. The resulting sample was enriched in the larger particles. The process was repeated with the clear solution for further separation of particles of different sizes. A series of samples with different average sizes can be obtained by repeating the above procedure.

Figure 21:
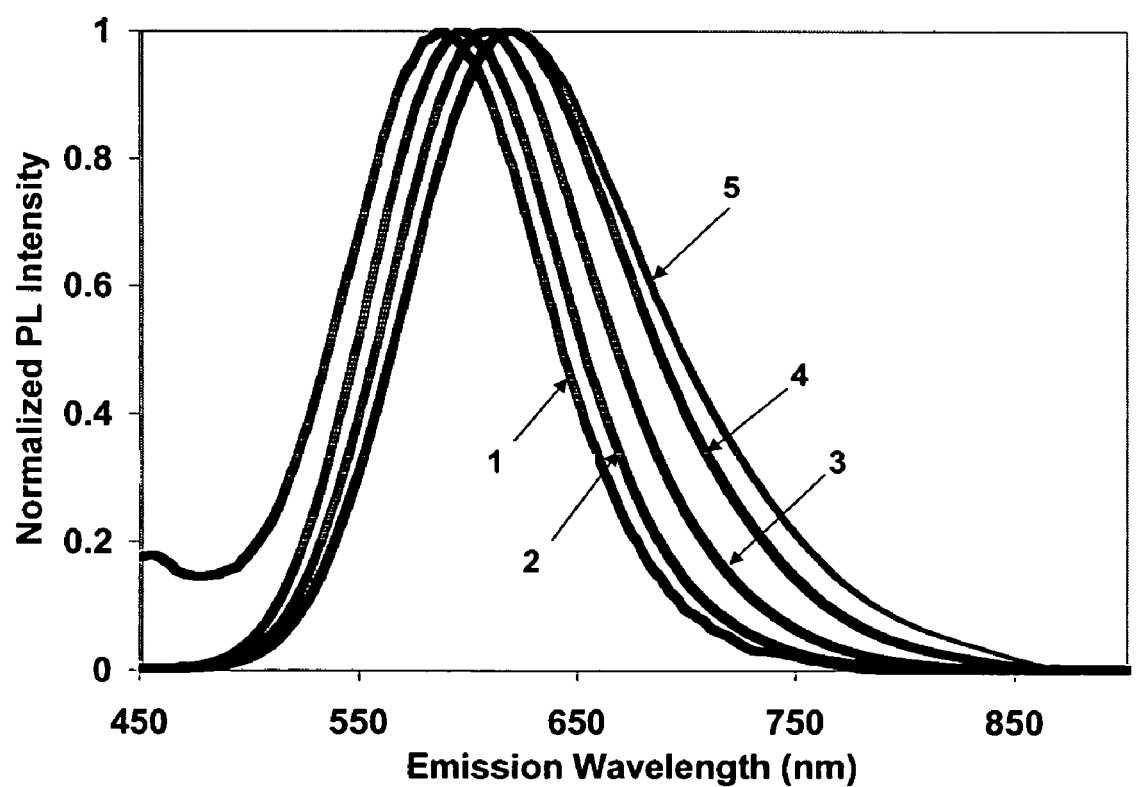
FIG. 21 is a graphic representation of PL spectra from samples of octadecene-coated particles in chloroform, treated by size-selective precipitation. The peak in the emission spectrum of the original etched sample is 610 nm. Peaks in the emission spectra of sample 1~5 shift to 620, 619, 608, 596, and 588 nm, respectively.

FIG. 21 shows normalized PL spectra for samples prepared by size-selective precipitation. The peak of the PL spectrum of the original etched sample is 610 nm, while peaks of samples 1 to 5 are at 620, 619, 608, 596, and 588 nm, shifting toward the blue. For size-dependent PL, shorter PL peak positions should correspond to smaller particle sizes. With increasing addition of methanol, the polarity of the solution increased and the size of the separated particles decreased. Note that the PL spectrum of the first separated particle fraction does not shift much from the PL spectrum of the original etched particles. This suggests that there are some remaining agglomerates that consist of primary particles with a size distribution similar to that of original etched particles, and that this fraction of the particles precipitated first. This process provides an additional method to control the PL of coated particles.

Silicon nanoparticles with bright visible photoluminescence have been prepared by a new combined vapor-phase and solution-phase process, using only inexpensive commodity chemicals. In the examples described herein, $CO_2$ laser-induced pyrolysis of silane was used to produce silicon nanoparticles at high rates (20 to 200 mg/hour). Particles with an average diameter as small as 5 nm were prepared directly by this vapor phase (photothermal aerosol) synthesis. Acid etching these particles with mixtures of hydrofluoric acid and nitric acid reduced the size and passivated the surface of these particles such that after etching they exhibited bright visible luminescence at room temperature. The wavelength of maximum photoluminescence (PL) intensity was controlled from above 800 nm to below 500 nm by controlling the etching time and conditions. The luminescent particles were characterized by XRD, FTIR, and XPS. The results confirmed that crystalline silicon structures are present in both the original and etched particles. The expected XRD peak-broadening with decreasing particle size was observed. Rapid thermal oxidization of orange-emitting particles produced blue-emitting particles with peak PL emission near 420 nm.

Preparation of macroscopic quantities by the methods described here opens the door to chemical studies of free silicon nanoparticles that could previously be carried out only on porous silicon wafers, as well as to potential commercial applications of silicon nanoparticles. Although there have been a huge number of papers published on porous silicon (PSi) and on the surface chemistry of silica and flat silicon wafer surfaces, very little research has been done on the surface chemistry of luminescent silicon nanoparticles that are free of substrate and that have not been derived from PSi. Information from the literature on silicon wafers and PSi is very helpful in identifying functionalization routes for the free nanoparticles, but chemistry on the free nanoparticles sometimes proceeds much differently than on a bulk surface. In the present invention, for example, silicon nanoparticles are etched with $HF/HNO_3$ mixtures, etching mixtures that etch bulk silicon at several microns per minute, yet they etch the nanoparticles at much less than one nanometer per minute. The present invention allows the preparation of free silicon nanoparticles in macroscopic quantities, and enables research to be conducted directly on free luminescent silicon nanoparticles to achieve different surface functionalities for different potential applications.

Surface treated silicon nanoparticles were prepared by reaction with several reagents. Si—H terminated particle surfaces were generated by washing particles with aqueous HF solution. The relation between Si—H coverage and HF concentration was studied. Alkenes, such as octadecene and undecylenic acid, were attached to the particle surface via hydrosilylation reactions. FTIR spectra confirmed that these reagents were covalently bound to the silicon surface. Si—OH terminated surfaces were generated by washing particles with 20% $HNO_3$ or with concentrated sulfuric acid and hydrogen peroxide. Commercially available silanes can be attached to this surface and the FTIR results confirmed that octadecyltrimethoxysilane had been bound to the silicon surface covalently. These coated particle dispersions are very clear and can easily pass through 0.1 μm filter paper.

Surface coating of silicon nanoparticles increased the stability of their PL substantially. Dispersions of octadecene coated particles can be stored in air under fluorescent lighting for months without any measurable change in PL peak position or any decrease in PL intensity. Untreated samples usually experienced significant changes in PL peak position and intensity over a period of a few days. The surface-treated particle dispersions can be purified by dialysis and size exclusion chromatography. These separation technologies provide convenient methods for producing 'clean' particle dispersions. Excess reagents should be removed from the particle dispersion in order to obtain high quality TEM images and to prevent interference with subsequent processing of the particles. TEM imaging confirmed that there are crystalline nanoparticles with size less than 5 nm in the surface treated, luminescent particle dispersion. Size selective precipitation provided an additional means of tuning and narrowing the PL spectra.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims that follow.

What is claimed:

1. A process for producing photoluminescent silicon nanoparticles comprising:
   reacting a silicon precursor in the presence of a sheath gas with heat from a radiation beam under conditions effective to produce silicon nanoparticles and
   acid etching the silicon nanoparticles under conditions effective to produce photoluminescent silicon nanoparticles.

2. The process as claimed in claim 1, wherein the silicon precursor comprises a silane.

3. The process as claimed in claim 2, wherein the silane is $SiH_4$.

4. The process as claimed in claim 1, wherein the sheath gas comprises hydrogen.

5. The process as claimed in claim 4, wherein the sheath gas further comprises helium, argon, nitrogen, or a mixture thereof.

6. The process as claimed in claim 1, wherein the radiation beam is produced by a laser.

7. The process as claimed in claim 6, wherein the laser is a $CO_2$ laser.

8. The process as claimed in claim 1, wherein said reacting is carried out in the presence of a photosensitizer.

9. The process as claimed in claim 8, wherein the photosensitizer comprises sulfur hexafluoride or silicon tetrafluoride.

10. The process as claimed in claim 1 further comprising:
    collecting the silicon nanoparticles on a filter after said reacting and before said acid etching.

11. The process as claimed in claim 10, wherein the filter is a cellulose nitrate membrane filter.

12. The process as claimed in claim 1, wherein the silicon nanoparticles have an average diameter less than about 20 nm.

13. The process as claimed in claim 12, wherein the silicon nanoparticles have an average diameter from about 5 nm to 20 nm.

14. The process as claimed in claim 1, wherein said acid etching is carried out with a solution comprising hydrofluoric acid and nitric acid.

15. The process as claimed in claim 14, wherein the solution comprises about 0.5% to 20% hydrofluoric acid and about 10% to 40% nitric acid.

16. The process as claimed in claim 15, wherein the solution comprises about 3% hydrofluoric acid and about 32% nitric acid.

17. The process as claimed in claim 1, wherein the silicon nanoparticles are dispersed in a solvent prior to acid etching.

18. The process as claimed in claim 17, wherein the solvent is selected from the group consisting of water, methanol, or isopropanol.

19. The process as claimed in claim 18, wherein the solvent is methanol.

20. The process as claimed in claim 1 further comprising:
collecting the photoluminescent silicon nanoparticles on a filter after said acid etching.

21. The process as claimed in claim 20 further comprising:
washing the photoluminescent silicon nanoparticles after said collecting.

22. The process as claimed in claim 1 further comprising:
treating the photoluminescent silicon nanoparticles with an oxidizer.

23. The process as claimed in claim 22, wherein the oxidizer is a nitric acid solution.

24. The process as claimed in claim 23, wherein the oxidizer is an about 20% to 40% nitric acid solution.

25. The process as claimed in claim 24, wherein the oxidizer is a 30% nitric acid solution.

26. The process as claimed in claim 1 further comprising:
isolating the photoluminescent silicon nanoparticles having peak emission in the orange or red spectral region and
treating the isolated photoluminescent silicon nanoparticles under conditions effective to induce rapid thermal surface oxidation of the particle surface.

27. A process for producing photoluminescent silicon nanoparticles comprising:
thermally decomposing a silicon precursor in the presence of a sheath gas with $CO_2$ laser radiation under conditions effective to produce silicon nanoparticles and
acid etching the silicon nanoparticles with a hydrofluoric acid and nitric acid solution under conditions effective to produce photoluminescent silicon nanoparticles.

28. A process for stabilizing photoluminescence of silicon nanoparticles comprising:
treating photoluminescent silicon nanoparticles under conditions effective to produce photoluminescent silicon nanoparticles having a Si—H terminated surface; and treating the Si—H surface-terminated nanoparticles under conditions effective to achieve particle surface hydrosilylation.

29. A process for stabilizing photoluminescence of silicon nanoparticles comprising:
treating photoluminescent silicon nanoparticles under conditions effective to produce photoluminescent silicon nanoparticles having a Si—OH terminated surface; and
treating the Si—OH surface-terminated nanoparticles under conditions effective to achieve particle surface silanization.

* * * * *